United States Patent
Lawson et al.

(10) Patent No.: US 8,464,196 B1
(45) Date of Patent: Jun. 11, 2013

(54) METHOD AND SYSTEM FOR ROUTING OPTIMALLY BETWEEN TERMINALS THROUGH INTERMEDIATE VIAS IN A CIRCUIT DESIGN

(75) Inventors: Randall Scott Lawson, Seabrook, NH (US); Sean Bergan, Andover, MA (US); Joseph Dexter Smedley, Chelmsford, MA (US); Paul S. Musto, Hollis, NH (US); Brett Allen Neal, Monument, CO (US); Richard Allen Woodward, Jr., San Diego, CA (US); Jelena Radumilo-Franklin, Westford, MA (US); Frank Farmar, Amherst, NH (US); Gregory M. Horlick, Madison, AL (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/432,904

(22) Filed: Mar. 28, 2012

(51) Int. Cl.
*G06F 17/50* (2006.01)

(52) U.S. Cl.
USPC .................... 716/126; 716/129; 716/130

(58) Field of Classification Search
USPC .................................. 716/126, 129–130
See application file for complete search history.

(56) References Cited

U.S. PATENT DOCUMENTS

| | | | | |
|---|---|---|---|---|
| 4,484,292 A * | 11/1984 | Hong et al. | | 716/129 |
| 6,240,541 B1 * | 5/2001 | Yasuda et al. | | 716/112 |
| 6,324,675 B1 * | 11/2001 | Dutta et al. | | 716/130 |
| 6,434,016 B2 * | 8/2002 | Zeng et al. | | 361/760 |
| 6,477,515 B1 * | 11/2002 | Boroujerdi et al. | | 706/14 |
| 6,543,043 B1 * | 4/2003 | Wang et al. | | 716/122 |
| 6,598,215 B2 * | 7/2003 | Das et al. | | 716/130 |
| 7,076,537 B2 * | 7/2006 | Ward et al. | | 709/220 |
| 7,117,459 B2 * | 10/2006 | Tanimoto et al. | | 716/112 |
| 7,266,799 B2 * | 9/2007 | Ito | | 716/129 |
| 7,376,914 B2 * | 5/2008 | Douriet et al. | | 716/127 |
| 7,536,665 B1 | 5/2009 | Horlick et al. | | |
| 7,571,411 B2 * | 8/2009 | Hentschke et al. | | 716/126 |
| 7,728,428 B2 * | 6/2010 | Lim | | 257/724 |
| 7,761,836 B1 * | 7/2010 | Wadland et al. | | 716/130 |
| 7,853,915 B2 * | 12/2010 | Saxena et al. | | 716/129 |
| 7,953,551 B2 * | 5/2011 | Park et al. | | 701/416 |
| 8,095,903 B2 * | 1/2012 | Birch et al. | | 716/126 |
| 2005/0132320 A1 * | 6/2005 | Allen et al. | | 716/18 |
| 2006/0242614 A1 | 10/2006 | Wadland et al. | | |
| 2007/0101303 A1 * | 5/2007 | Lien et al. | | 716/5 |
| 2008/0072182 A1 * | 3/2008 | He et al. | | 716/2 |
| 2009/0289363 A1 * | 11/2009 | Coates et al. | | 257/738 |

* cited by examiner

*Primary Examiner* — Naum Levin
(74) *Attorney, Agent, or Firm* — Rosenberg, Klein & Lee

(57) ABSTRACT

A system and method are provided for establishing an automated routing environment in an electronic design automation (EDA) work flow for the routing of a circuit design. A user may merely specify a flow via pattern, a flow via location, and a start and end terminal and thereby, the auto router or path finder will automatically find the least-cost paths between each of the start terminals through at least one intermediate via of the flow via and ending at an end terminal. Upon successful routing of all needed terminals, an at least partially routed circuit design may be output.

9 Claims, 40 Drawing Sheets

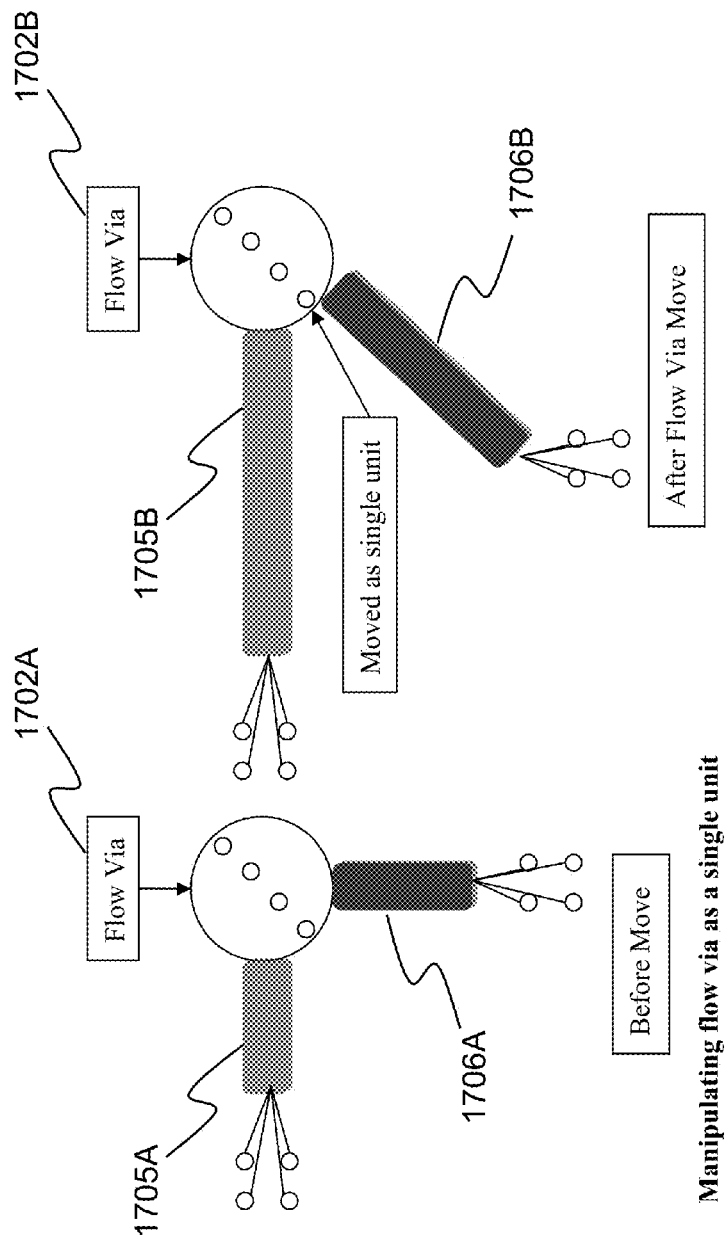

Manipulating individual vias referenced by flow via

Assigned and Unassigned vias referenced by flow via

Crossing on the same layer at the flow via

Crossing on different layers at the flow via

Crossing on both same & different layers at the flow via

Connecting to via at a cross cost

Single Flow Via routing

Single Flow Via routing

Single Flow Via routing

Single Flow Via routing

Single Flow Via routing

Single Flow Via routing

Multi Flow Via routing

Multi Flow Via routing

Multi Flow Via routing

METHOD AND SYSTEM FOR ROUTING OPTIMALLY BETWEEN TERMINALS THROUGH INTERMEDIATE VIAS IN A CIRCUIT DESIGN

BACKGROUND OF THE INVENTION

The subject system and method are generally directed to routing terminals through intermediate vias in a circuit design. The system and method provide automated measures for interacting with a developer, providing a developer with an autorouter capable of pathfinding, cost optimizing, and routing selectively to and from intermediate vias disposed between terminals. The system and method also provide flow vias which maintain a relationship between a plurality of vias collectively and are thereby manipulable as a group. As electronic design automation (EDA) and circuit design are becoming more and more complex, the demand for automated measures to establish circuit boards and integrated circuits (ICs) is increasing. Quickly generating a physical layout or etch mask from a logical schematic of a circuit is becoming increasingly important. In generating the layout or silicon realization by a designer, a dichotomy exists separating the ability to manually specify certain paths or interconnections between components and a largely automated router type system where input from a designer is generally not able to be accepted. Thus, on one hand, the manual layout of paths between components is a very arduous, time-consuming, and error-prone activity requiring many man hours from groups of engineers and often delaying product launch substantially but yet yielding a solution that meets certain requirements. On the other hand, an automated routing approach generally lacks the ability to take as input certain design preferences or instructions from the designers.

Thus, the conventional automated routing approach, while it may be quicker, may not arrive at the optimum or desired solutions. Moreover, auto routers in the past have generally not been suitably configurable. Generally, a source component and a target component are specified, and the auto router determines on a per-connection basis an acceptable route between each pin of the components. This auto-routing method would automatically place vias through the layers of the integrated circuit or circuit board wherever it calculates to be acceptable. Unfortunately, this results in a haphazard scattering of vias throughout the circuitboard or integrated circuit (used interchangeably herein) and is often sub-optimal.

Often each independent connection is calculated to be the most efficient and thereby, the connection between components will suffer from different lengths resulting in delay issues between the signals. Indeed, differential pairs may pose problems that require manual intervention to resolve, as will phase, cross coupling, and the like. The end result of such auto-routers generally is a lack of clean routing paths with a largely random or non-matching pattern. Still further, auto-routers of the past have not allowed for the intermixing of ground and power vias as needed. The user has heretofore been unable to even specify the location of each via to meet design needs.

There is therefore a need for a system and method for automatically routing interconnections between components or sets of terminals through an intermediate via and to another set of terminals or components. There is a need for a system and method which provides for user-specified via location. There is a need for a system and method to automatically provide for logical groupings of vias into flow vias, allowing for the common manipulation of all vias in the flow via set. There is a need for a system and method to allow the user to specifically locate the vias within a flow via or to use a predetermined flow via pattern. There is a need for a system and method enabling a user to establish a flow via pattern to address and resolve design needs which may include the intermixing of ground and power vias therein to provide, for example, shielding, more precise control of delay coordination, crosstalk amelioration, cross-coupling, phase control, and the like. There is a need for a system and method to automatically locate the most optimal paths for a plurality of interconnections to a shared common via. There is a need for a system and method that is capable of routing bundles and flows of connections as one logical group to and from a flow via. There is a need for a system and method to provide clean routing responsive to user specifications.

It is to be understood that the description of the exemplary embodiments below are not intended to limit the scope of the present invention to EDA embodiments or to any particular environment, application, language, circuit bearing medium, package type, or format.

SUMMARY OF THE INVENTION

It is an object of the present invention to provide a system and method for automatically routing interconnections between components or sets of terminals through at least one intermediate via and to another set of terminals or components.

It is a further object of the present invention to provide a system and method which provides for user-specified via location.

It is a further object of the present invention to provide a system and method to automatically provide for groupings of vias into flow vias, allowing for the common manipulation of all vias in the flow via set.

It is still a further object of the present invention to provide a system and method to allow the user to specifically locate the vias within a flow via or to use a predetermined flow via pattern which may include the intermixing of ground and power vias therein to provide, for example, shielding, more precise control of delay coordination, crosstalk/cross-coupling amelioration, phase control, and the like.

It is still a further object of the present invention to provide a system and method to automatically locate the most optimal paths for a plurality of interconnections to a shared common via flow.

It is yet another object of the present invention to provide a system and method that is capable of routing bundles and flows of connections as one group to a flow via.

It is still a further object of the present invention to provide a system and method to provide clean routing responsive to user specifications.

A method realized in accordance with the present invention comprises establishing a circuit design implemented on a plurality of circuit layers. The circuit design includes a set of first terminals, a set of second terminals, and a plurality of vias extending between adjacent ones of the circuit layers. A plurality of intended connections between the first terminals and corresponding ones of the second terminals are predefined. A processor is executed to selectively generate a least-cost forward connection path between each of the first terminals and a corresponding one of the vias and a least-cost reverse connection path between each of the second terminals and a corresponding one of the vias. A conflict resolution engine is then executed responsive to detection of a conflict between the least-cost forward connection paths and between the least-cost reverse connection paths to maintain at most one each of said least-cost forward and least-cost reverse connection paths coupled to each of the vias. The least-cost forward and reverse connection paths are selectively paired according to the predefinition of intended connections to thereby generate at least one routing connection.

Another method realized in accordance with the present invention comprises establishing a circuit design, the circuit design including a plurality of circuit layers, a set of first terminals, a set of second terminals, and a plurality of selectively positioned vias, each extending between adjacent ones of the circuit layers. A plurality of pre-defined intended connections between the first and second terminals are then established. Connection segments are then selectively generated between (1) each of the first terminals in a corresponding one of the vias, and (2) each of the second terminals and a corresponding one of the vias. Each connection segment is generated to minimize a costly interconnection based on a set of predetermined criteria, including at least a connection distance parameter. Interconnections are selectively established to couple pairs of connection segments. Electrical misconnections are identified based at least in part on a comparison of the interconnections and the predefined intended interconnections. A cost-based resolution engine is executed to regenerate at least one connection segment responsive to a positive identification of at least one electrical misconnection to resolve the misconnection. A routed circuit design is generated to include the interconnections between the first and second terminals.

Another method realized in accordance with the present invention comprises establishing a circuit design implemented on a plurality of circuit layers, the circuit design including a set of first terminals and a set of second terminals. A predefined list of intended interconnections between each of the first and second terminals is established. A plurality of vias extending between adjacent ones of the circuit layers at selected positions in the circuit designs are established. Paths between each first terminal and a corresponding second terminal through at least one via are then selectively identified. The paths are at least partially based on a path cost, the path cost being based on a set of predetermined criteria including at least a distance parameter of the path. Paths which have electrical conflicts based on at least one of disconnects or crosses are identified responsive to an evaluation of each of the paths and the predefined list of intended interconnections. A conflict cost is then established responsive to identification of a conflict. At least one portion of a conflicting path is regenerated based upon an evaluation of conflict cost and path cost. A routed circuit is then generated based on the paths between first and second terminals.

A system realized in accordance with the present invention comprises a memory storing a circuit design implemented on a plurality of circuit layers, the circuit design including a set of first terminals, a set of second terminals, and a plurality of vias extending between these circuit layers. A user interface which is functionally coupled to the memory predefines a plurality of intended connections between the first terminals and corresponding ones of the second terminals. A computer processor is functionally coupled to the memory and the user interface. The computer processor selectively generates a least-cost forward connection path between each of the first terminals and a corresponding one of the vias, and a least-cost reverse connection path between each of the second terminals and a corresponding one of the vias. The computer processor executes a conflict resolution engine responsive to detection of the conflict between the least-cost forward connection paths and between the least-cost reverse connection paths to maintain at most one each of the one-least forward and least-cost reverse connection paths coupled to each of the vias. The computer processor then selectively pairs the least-cost forward and reverse connection paths according to the predefinition of intended connections to generate at least one routing connection. The computer processor then displays the routing connection on the user interface to a user or stores the routing connection into the memory.

Another system realized in accordance with the present invention comprises a circuit design unit, which establishes and maintains a circuit design implemented on a plurality of circuit layers. The circuit design includes a set of first terminals and a set of second terminals. The circuit design unit also establishing and maintaining a predefined list of intended interconnections between each of the first and second terminals. A via control unit establishes a plurality of vias extending between circuit layers in the circuit design. A path finder unit generates a path between each first terminal and a corresponding second terminal through at least one intermediate via. A cost initializer unit identifies paths having an electrical conflict based at least in part upon a comparison of each path and a predefined list of intended interconnections. The cost initializer unit also establishes a conflict cost responsive to identification of a conflicting path. A conflict resolution unit regenerates at least one portion of the conflicting path based upon a comparison between a path cost parameter and a conflict cost. A path installer unit generates a routed circuit design based on the paths and displays the routed circuit design or actuates the circuit design unit to stores the routed circuit design.

Additional aspects and utilities of the present general inventive concept will be set forth in part in the description which follows, and, in part, will be apparent from the description, or may be learned by practice of the general inventive concept.

BRIEF DESCRIPTION OF THE DRAWINGS

FIG. 3A is a schematic view of an illustrative simplified example of a predefined flow via with both ground and power vias;

FIG. 17A is a schematic view of an exemplary simplified layout of a first set of terminals interconnecting intermediately through a flow via to another set of terminals;

FIG. 17B a schematic view illustrating the logical grouping of a plurality of vias into a flow via, showing the common manipulability of the entirety of the flow via and the connection flows plastically deforming to follow the manipulation of the flow via;

DETAILED DESCRIPTION OF THE PREFERRED EMBODIMENTS

Figure 1:
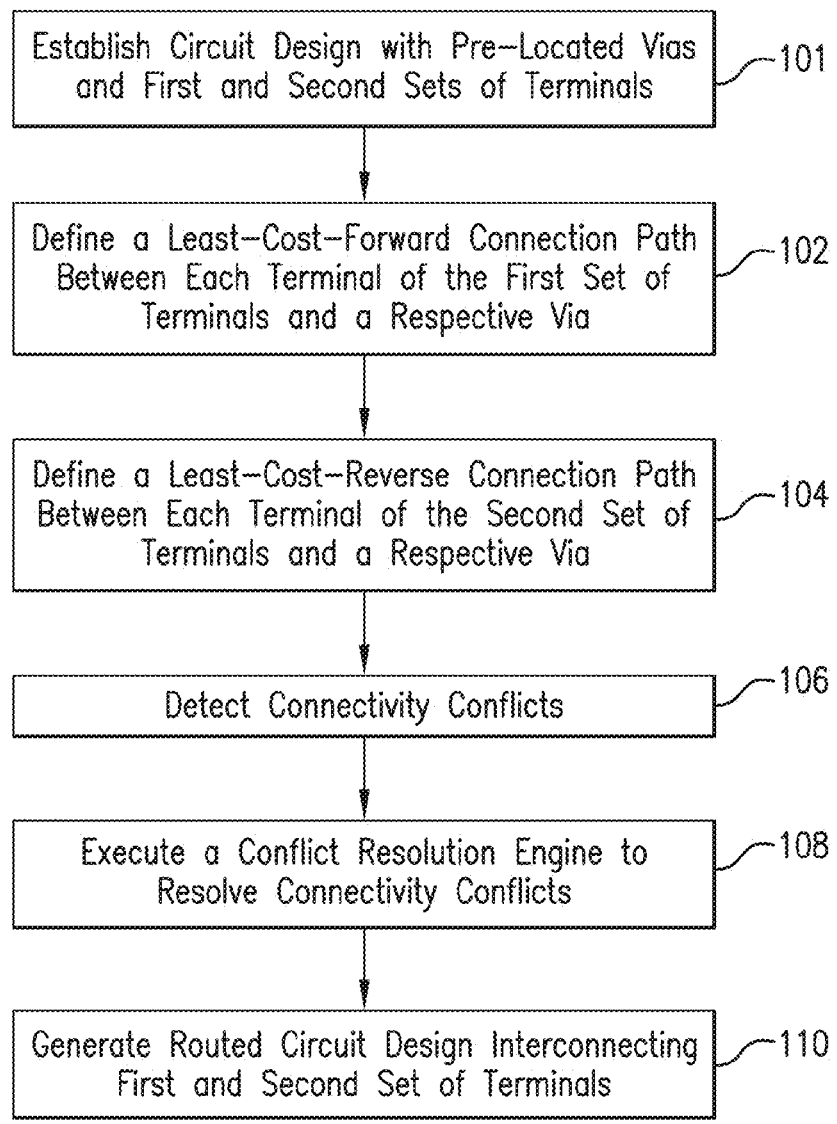
FIG. 1 is a simplified flow diagram illustrating an exemplary routing flow of an EDA process in accord with an exemplary embodiment of the present invention.

Reference will now be made in detail to the embodiments of the present general inventive concept, examples of which are illustrated in the accompanying Drawings, wherein like reference numerals refer to like elements throughout. It is to be understood that while disclosed with reference to exemplary embodiments described below, the present invention is not limited to such illustrative embodiments themselves.

Systems, connected components, integrated circuits (ICs), microchips, systems-on-chip, circuitboards, and the like, may be modeled in a variety of different ways in an electronic design automation (EDA) flow. For example, some of the ways of modeling a system include a merely logical schematic diagram which omits all physical characteristics or dimensionality and merely shows simplified or abstracted representations of components or cells within the device.

Another manner of representing a system is a physical layout which shows an almost fully elaborated schematic with actual physical components representing their actual physical dimensionality and which are laid out in a topographical manner as they are intended to be actually physically realized on the generally silicon circuit-bearing-medium by a fabrication house or foundry. While the logical schematic is very conceptual and abstracted, the generation of a more specific and fully-laid-out physical layout from the abstracted schematic is necessary for circuit design to conclude with a physical working product.

A logical schematic design may include a net list which logically specifies interconnections between components or terminals of components. A physical layout, circuit realization, or silicon etch mask, on the other hand, must actually lay out the interconnections in precise detail to physically interconnect components and terminals thereof with a specified path. Moreover, a logical representation, such as a net list, may merely specify a terminal of one component to be connected to a terminal of another, whereas the physical layout must actually specify the path taken from one terminal to another traversing across the circuitboard, IC, package, or the like. Further complicating the situation is that an integrated circuit or circuitboard may have a plurality of different layers housing the components or terminals. Therefore, to interconnect two terminals of a design, a via or hole through the board, must occasionally be established and utilized for the electrically conductive path to flow through from one layer to another layer. Such inter-layer routing may be necessary in a particular design to avoid an obstacle, to comply with a design rule, to minimize interference, to interconnect terminals laying on different layers, and the like.

Were there but two terminals to be interconnected or merely two components to be connected in a vacuum, such interconnection may be a relatively simple process. However, with a modern circuitboard or integrated circuit having a staggering number of different components crammed into an exceedingly small space and having a massive number of constraints and rules to be followed, physically allocating space on the circuitboard or integrated circuit to etch conductive vias, paths, traces, or tracks, becomes a very complicated problem. Moreover, finding not just any conductive path between components in three dimensions, but one that balances competing interests, and optimizes in a plurality of domains, such as signal and power, crosstalk, delay, heat dissipation, and the like, becomes a very difficult task.

A system and method realized in accordance with the present invention seeks to dramatically reduce these problems with implementing interconnections between components or terminals, perhaps even situated respectively on differing layers of an integrated circuit or circuitboard and provide an automated means for finding the most optimal path responsive to a plurality of criteria for routing these connections. Moreover, a system and method realized in accordance with the present invention seeks to enable more user input and control over certain features, such as the grouping and placement of connective lines and vias to meet certain design goals of the user.

Briefly, a system and method realized in accordance with an exemplary embodiment of the present invention preferably operates as follows. Initially, without regard to electrical misconnections, a search is made for the shortest or least cost path between each of a first set of terminals and any available via to establish for each of the first set's terminals a least-cost-forward path. Then, a least-cost-reverse-path connection is established from each of a second set of terminals to any of the vias (regardless of association with terminals of the first set). The forward and reverse costs for the terminals to vias are recorded in a data model, database, or other storage device suitably optimized for quick searching and routing. The terminal-via interconnections are evaluated to determine if any misconnections (such as two terminals being 'crossed' by interconnection to a common via or a net remaining unconnected) exist. If so, a conflict resolution engine is executed to resolve those conflicts. The conflict resolution engine is also executed, preferably, when corresponding terminals in the first and second sets which should interconnect through the same intermediate via are not. The conflict resolution engine executes to suitably resolve the conflict and yield a completed connection of the corresponding terminals through the same via. Upon completion of conflict resolution, at least a partially routed circuit design interconnecting the first and second set of terminals through the vias is generated. This generated routed circuit design is either displayed to a user or stored into the storage medium.

As is used in the art, a "design" is an electronic design automation (EDA) database or data model of information describing a printed circuitboard (PCB), an integrated circuit (IC), or an IC package. A graphical representation of a portion of a design is illustrated at 200 in FIG. 2. A "terminal" 2021 is located on one or more layers of a design to which electrical signals may be connected. For a PCB, terminals correspond to the pins, pads, and balls of the elements in the circuit. For an IC package, terminals are typically IC bumps or package balls. A terminal may also be a junction point, such as a virtual pin or a T-junction. Multiple terminals that are grouped together such as depicted at 202 may be part of a "component," or they may merely be an interface or header. Components to be interconnected may lie on the same level of a design or they may be separately situated on different layers. Often times, forming a path that interconnects components on the same layer, may nonetheless, need to traverse other layers of the design to establish an optimal interconnection or to satisfy design rules.

Figure 2:
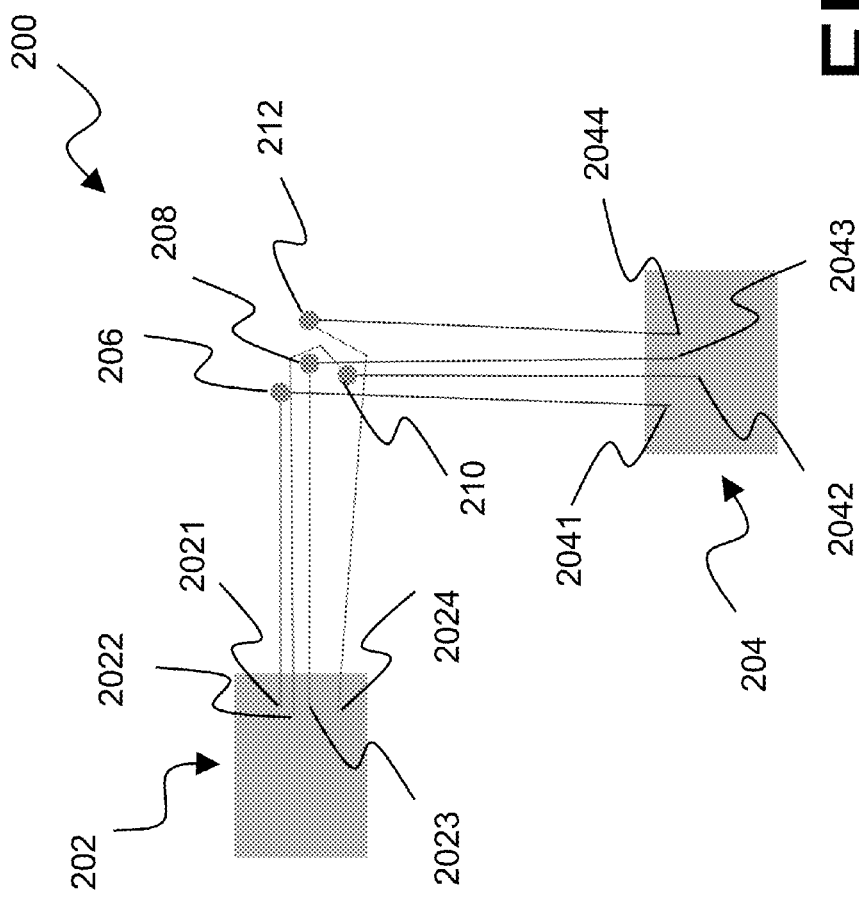
FIG. 2 is a schematic view of an exemplary product of an auto router demonstrating unclean paths where etch lengths are haphazard and not matched well to provide suitable signal characteristics.

A "rat" is a connection between two terminals, i.e., a "source terminal" such as 2021 and a "target terminal" 2041 in FIG. 2. A rat may be unrouted, as shown at 503 of FIG. 5, where the rat has yet to possess geometric information defining its precise path in the design, or a rat may be routed as shown at 512 of FIG. 5, where the rat has complete geometric information specifying its ordered sequence of "segments," an example of which is shown at 3700 of FIG. 37. The segment ordering is typically indexed or referenced starting at the source terminal 2021 of FIG. 2 and ending at the target terminal 2041. For simplicity herein, it may be assumed that if a rat connects a source terminal to a via and a rat connects a target terminal to that same via, then an interconnection may be considered to exist between source and target terminals.

A "net" may be a pairing of terminals to be connected at some point which may be embodied in a collection of rats connecting the pair of terminals. In some cases, the specific connections between terminals formed by certain rats are predetermined. In other cases, the rats are assembled into a net in an order or "sequence" that is either established by the auto router or is constrained by certain rules. For example, in the absence of any connectivity rules, the auto router may change the collection of rats as needed, provided the new collection still connects all of the terminals of the net. Such collection of rats may be specified by a user to form a logical group such as a bundle or flow.

Figure 3:
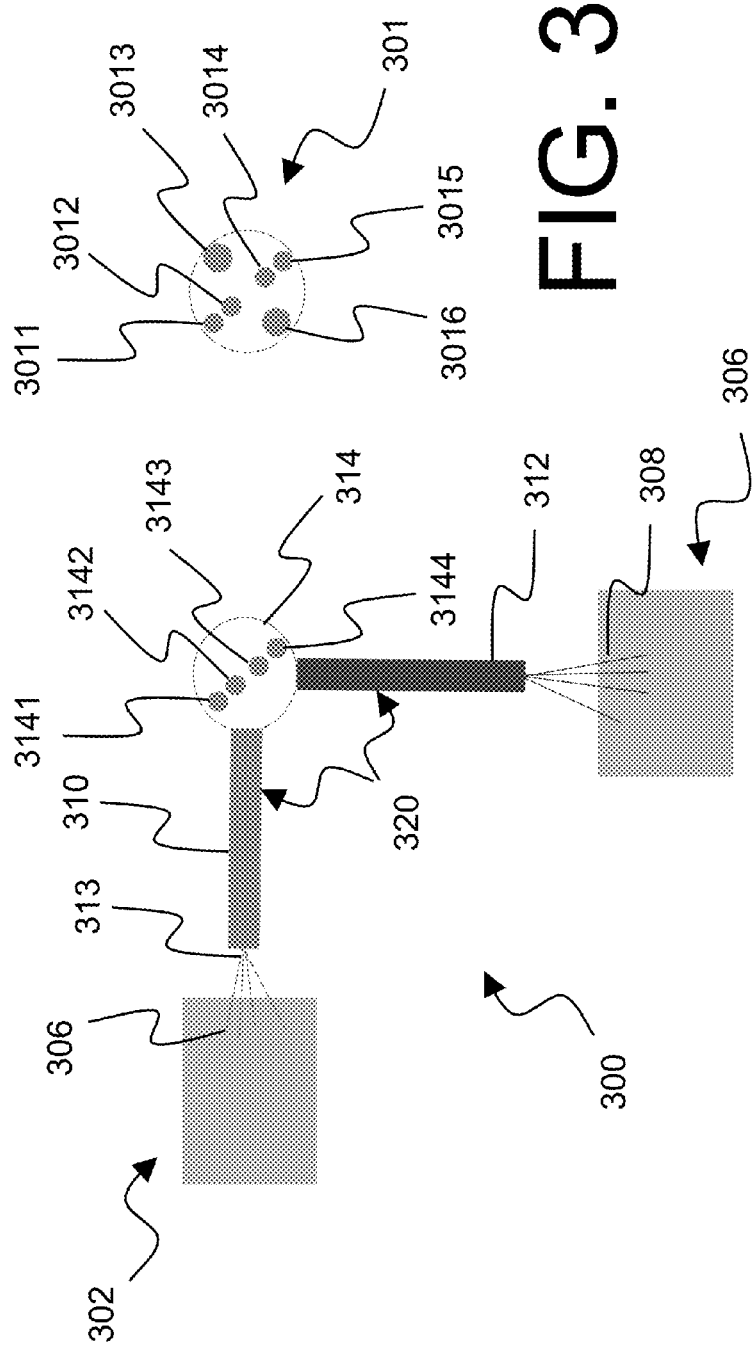
FIG. 3 is a schematic view of an illustrative simplified example of a routed interconnection between two components and a flow via.

Referring now to FIG. 3, there is shown a "bundle" 310 of rats which, in accordance with the present invention, may be a collection of rats determined by the designer or the auto router to be routed together. In certain embodiments, a bundle is displayed as a "fat rat," which, as described above, is a wide line indicating more than one rat. The fat rat includes a plurality of "rake lines" 306 extending therefrom. The rake lines 306 graphically connect the terminals and the rats to the fat rat 310 at a common location, referring to herein as a "gather point," as shown at 313.

As used herein, a "flow" is a path for a bundle, such as that illustrated by the traversal of fat rat 310 in FIG. 3. A flow may provide geometric input to the auto router to be used when auto routing rats in that bundle.

Figure 4:
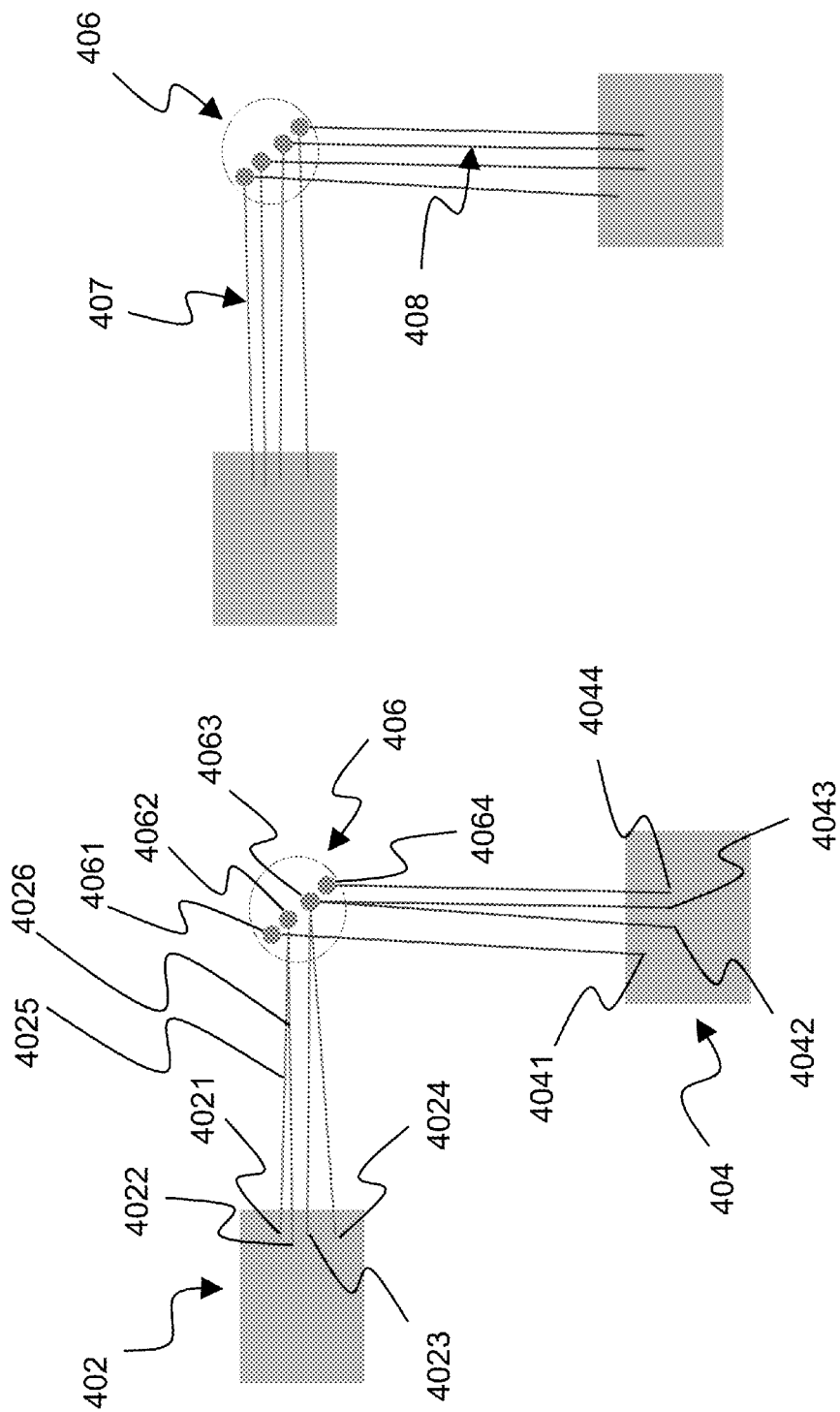
FIG. 4A is a schematic view of another exemplary intermediate routing iteration in accordance with an exemplary embodiment of the present invention.
FIG. 4B is a schematic view of an exemplary optimized routing solution in accordance with an embodiment of the present invention.

Referring to FIG. 3, it is illustrated that a flow, as seen at 310 or 312, may include multiple path lines 407 and 408 as seen in FIG. 4B as connected by zero or more "flow vias" 406. A "flow via" may indicate where vias should be placed when a rat path needs to change routing layers. Additionally, a "flow via" may be established by a predefined pattern or may be established manually by a user to include a plurality of vias grouped together to be collectively and/or individually manipulable. Each path line 407, 408 may be included in one or more "flow segments," such as those illustrated at 310 and 312 of FIG. 3.

As seen in the illustrative simplified flow chart of FIG. 1, a circuit design with at least a first and second set of terminals thereon is established. The user may be able to locate or specify the location of vias through which to pass in interconnecting the terminals.

At block 102, a least-cost forward connection path between each terminal of the first set of terminals and a corresponding via is defined. At step 104, a least-cost reverse connection path between each terminal of the second set of terminals and a respective via is defined. At block 106, any connectivity conflicts such as opens, disconnects, crosses, short circuits, or generally, any mismatch of nets connecting on the same via or vias, are detected. If indeed any connectivity conflicts were detected at block 106, at block 108 a conflict resolution engine is executed to resolve those connectivity conflicts. Such resolution may involve an iterative loop through a cross conflict resolution algorithm that allows for crosses, yet iteratively increases the cost of the crosses or disconnects. Thereby, each of the sets of terminals can find their cheapest cost path. Such cost may be defined by a plurality of metrics, such as, for example, shortest-path, most-direct route, and the like. These individual costs to connect a given terminal are recorded, preferably in a data model, or other database. Any storage system may be utilized, provided that it is suitably configured for storage, retrieval and searching thereof.

At block 110, after completing the conflict resolution to resolve connectivity conflicts, a more fully routed circuit design interconnecting both the first and second set of terminals through the intermediate vias is generated and either output display-wise to a user, stored as a completed circuit design in the storage area, and/or provided to a next stage of the EDA flow, such as actual circuit fabrication.

Figure 1A:
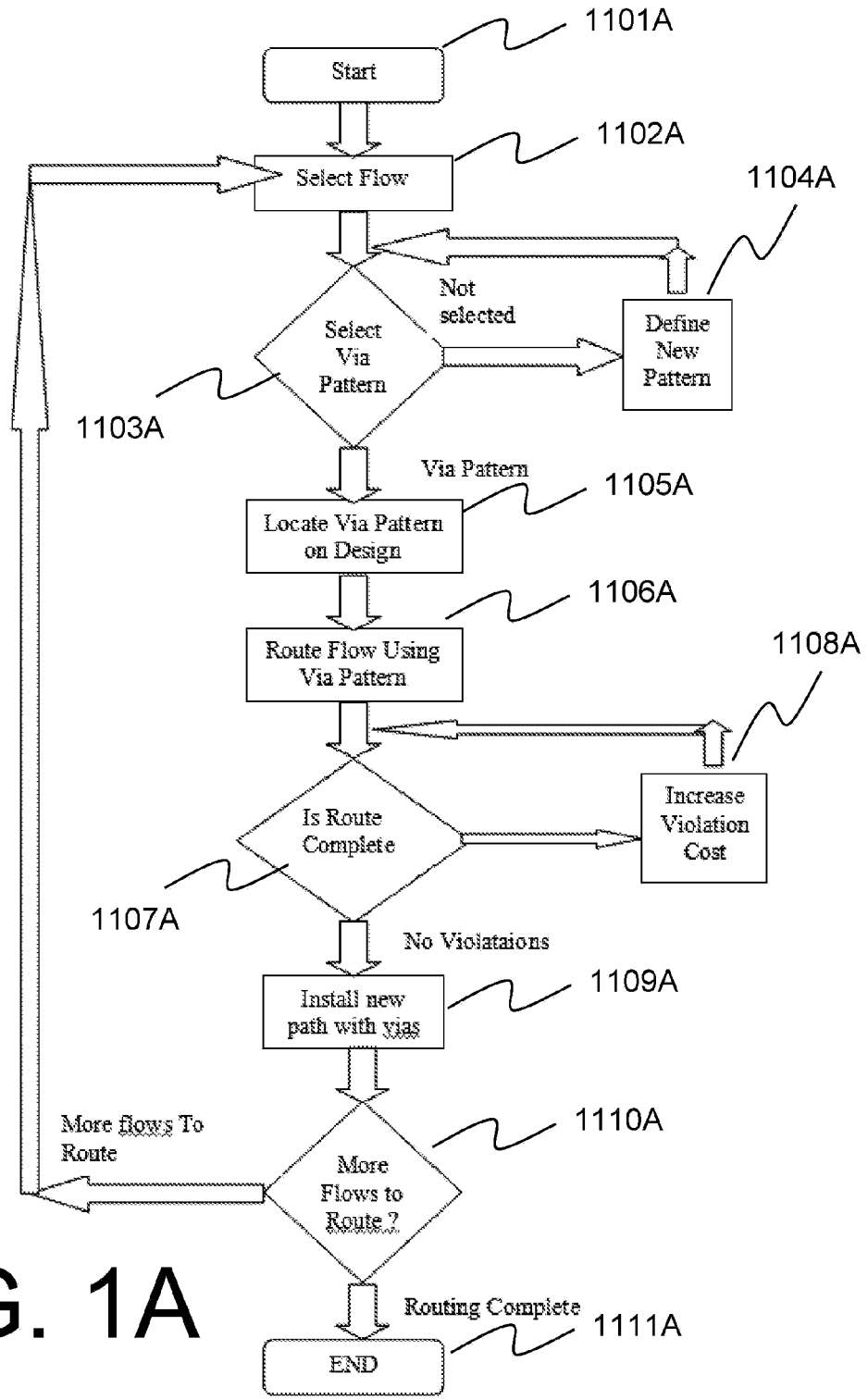
FIG. 1A is a simplified flow diagram more comprehensively elaborating an illustrative exemplary routing flow of an EDA process.

As seen in more detail in the illustrative simplified flow chart of FIG. 1A, a path finding and interconnection method is commenced at block 1101A. At block 1102A, a flow is selected. A flow may be a bundle or grouping of different interconnections. At block 1103A, a user may select a flow via pattern. Such flow via pattern may be any of a plurality of predefined via patterns such as, for example, diagonal left, diagonal right, horizontal arrangement, vertical arrangement, a pattern that includes an intermixed ground and/or power vias, and the like. If none of the predefined flow via patterns are selected at block 1103A, the user may be prompted at block 1104A through a user interface to define a new pattern. Such a new pattern may allow the user to precisely specify the location of each via, ground, power, and the like within a predefined flow via area.

The flow may then progress back to block 1103A where a user may select a via pattern including the recently defined pattern that was defined at 1104A. Once a via pattern has been selected at block 1103, the flow proceeds to block 1105A which allows the user interface to provide the user with measures for locating the via pattern on the design. Herein, the user may specify exactly where geometrically or topologically, such as through Cartesian coordinates (e.g. x,y,z), in the design the flow via is to be placed. Flow progresses to block 1106A where the flow is routed using the flow via pattern. Thereby, each rat that makes up the flow is routed each between a starting terminal or starting component and a least-cost via of the flow via. At block 1107A, it is evaluated whether the route is complete between each of a first terminal or first component and a second terminal or second component, as preferably defined by a net list which maintains a list of intended connections between components or terminals. If the route is not complete, which may be due to opens, disconnects, electrical misconnections, or crossings of the intended nets at a via, a cross conflict resolution algorithm is utilized whereby the violation cost or the cost of the misconnections is increased at block 1108A. The route-complete evaluation at block 1107A and the increasing violation cost at block 1108A are iterated with a repeating evaluation and subsequent increase in cost to thereby competitively determine the most efficient and optimized routing of the individual rats, segments, paths, or connection lines in the flow to the vias resulting in a properly connected sequence. A connection may not necessarily be established and finalized merely because it came first algorithmically; rather, the summed costs of all segments in a flow or net are compared to the costs of other nets to establish, in a preferred embodiment, the cheapest total cost to route all nets. Once the routing is complete at block 1107A, flow progresses to block 1109A where the new path is installed into the design. At block 1110A, it is determined whether there are more flows to be routed and if so, the flow progresses back to block 1102A to repeat the flow. If, however, all of the flows have been successfully routed then the flow progresses to a routing-complete end block 1111A.

As seen in FIG. 2, a first component or element 202 has a plurality of pins 2021, 2022, 2023, and 2024 to be connected to a second component 204. The second component 204 has a plurality of pins or terminals 2041-2044. The routed design 200 is illustrative of a more conventional autorouting approach where the vias are semi-randomly or algorithmically placed with respect to the circuit design through the actual routing/pathfinding process and contemporaneous therewith. Such a conventional approach merely seeks to connect the terminals of the two components 202 and 204, each being, potentially, on different layers of the circuit design. The auto routing method merely seeks to provide the least cost path from a first set of terminals to a second set of terminals and automatically places a via wherever it finds most efficient or optimal. Therefore, the routing algorithm in the exemplary routed design 200 has randomly placed vias 206, 208, 210, and 212 wherever it deemed to be most efficient. Such a method for autorouting has several material disadvantages, including that the user is unable to specify the location in advance of routing for the vias; the vias are randomly placed perhaps in scattered arrangement; and with no logical relationship one to another. Therefore, flow vias or established groupings of vias having a logical relationship and being collectively and/or individually manipulable are not possible. Still further, the resultant routed design suffers from a vastly divergent path length for each of the rats. Therefore, a variety of problems may emerge from this including delay/timing mismatching resulting in waiting for the weakest link in the chain whereby the entirety of the signal transmitted from the first component 202 to a second component 204 may be held back by the longest route or the slowest propagation. Further, an unclean or rat's nest type approach may result which complicates design and debugging—and increases the likelihood of designer mistakes. Also, as the vias are quasi-randomly allocated, they are not able to follow a predefined flow via pattern which may beneficially include the intermixing of both ground and power signals amongst other benefits such as beneficial differential pair treatment.

As seen in FIG. 3, an illustrative routed circuit design 300 of the present invention is shown. Routed design 300 includes a first component or grouping of terminals 302 and a second component or grouping of terminals 304. First component 302 includes, illustratively, at least one terminal 306 connected to a flow 310 by a plurality of rake lines 313. Each flow segment 310 and 312 collectively form a flow 320 which completely connects first component 302 and second component 304 through an intermediary flow via 314. Flow via 314 may be any of a predefined flow via patterns such as the one seen at predefined flow via 301 of FIG. 3A which may include an intermixing of power and/or ground vias. Flow via 314 includes a plurality of vias 3141-3144 collectively defined as a flow via 314 and being collectively or individually modifiable, manipulable, and movable. Thereby, a complete circuit between terminal 306 and an end terminal 308 of the second component 306 is established.

As seen in FIG. 3A, Flow via 301 shows one of many different permutations of different predetermined patterns for the vias within a given flow via. In this exemplary embodiment, a power via 3016 is established, as is a ground via 3013. The power and ground vias may be swapped, changed, or reconfigured; both vias may be power vias, both may be ground, or any number of permutations are possible. A plurality of unassigned or unassociated vias 3011-3015 are established as well. Whereas in the previous art, the auto router itself might establish quasi-random via locations based upon shortest path or least cost, a user herein is empowered to configure or selectively dispose, locate, and configure flow vias. Thereby, differential pair problems may be addressed, ground and power matching, cross-conductance, coupling, phase and/or delay may be optimized or modified to suit a particular design requirement. Once a flow via has been established, it may be saved and later recalled as a saved profile flow via.

As seen in FIG. 4A, a first component 402 has a plurality of terminals 4021-4024 and a second component 404 which has a plurality of terminals 4041-4044. A flow via 406 has been established and located by a user to include a predetermined flow via pattern having four vias 4061-4064 arranged in a rightward downwardly sloping pattern. As illustrated in FIG. 4A, the auto router may have attempted to connect the terminals 4021-4024 to a via 4061-4064 respectively in flow via 406. This connection may have been performed irrespective of crosses and electrical misconnections and instead the rats or connections were formed merely responsive to, for example, a shortest-path-first or least-cost method. In accordance with certain embodiments of the present invention, crosses, opens, and electrical misconnections in general may be treated as zero cost or very low cost initially to enable the best, shortest, or least cost path or rat between each of the terminals and the vias irrespective of electrical misconnection. This establishes a baseline optimal or ideal path for each of the rats from a terminal to a corresponding via. It is worth noting that each of the vias are unassigned and therefore are each seeded as potential targets from any of the terminals.

Therefore, in an exemplary embodiment, a first step is to seed each of the terminals 4061-4064 as a target. Seeding each of the vias 4061-4064 may involve an attempted routing from the via out one unit to ensure that the via is electrically connectable. Moving out one unit from each of the vias also may establish a breadcrumb, pointer, or reference of sorts, whereby routing from a terminal to the via may actually target at the seeded breadcrumb, and the breadcrumb may then function as a pointer to resolve back to the actual via itself. In an embodiment of the present invention, each of the vias 4061-4064 is seeded to ensure that they are indeed electrically connectable. Then, a terminal 4021, for example, may seek to connect to a shortest or otherwise least expensive via 4061-4064 or breadcrumb/pointer thereof. Such a method may search or evaluate a plurality of different paths between any of the vias. Preferably, the costs associated with each in terms of length, divergence, turns, or any of a number of factors are recorded in a data model or database for later evaluation and comparison. However, each of terminals 4021-4024 are in turn connected respectively to a cheapest cost via such as 4062. It is seen that via 4062 shares an electrical misconnection such as a cross between rats 4023 and 4024 connecting respective terminals 4025 and 4026. In this instance at the initial stages of the routing method, this is perfectly permissible as a baseline for the least expensive via, irrespective of any electrical misconnections is being established and recorded for later comparison. Therefore, in the data model or database, it will be recorded in a preferred embodiment that the least expensive via for terminal 4021 would be via 4062. The exact path or paths between the two may be recorded as well. Correspondingly, the least expensive via for terminal 4022 would also be via 4062. Throughout the cross resolving engine or method the cost associated with each would be resolved through a comparison of different costs such as, for example, the cost of terminal 4021 to connect to via 4062 and the ultimately mutually exclusive terminal 4022 connecting to via 4062. Similarly, terminal 4023 has found the least expensive via to connect to would be via 4063. Conflictingly, terminal 4024 has also determined that via 4063 is the least expensive for it to connect to. In a preferred, though non-exclusive embodiment, at this initial stage, the cost of crosses or misconnections are not considered. A next step would be for terminals 4041-4044 to each respectively be attached to a corresponding least expensive via 4061-4064. Thereby, terminal 4041 has been determined to have a corresponding least-cost via 4061. Terminals 4042 and 4043 have found that their respective least cost via is via 4063. This conflict will be resolved later, as a cross or disconnect should not appear in a final routed product. Lastly, terminal 4044 has determined that via 4064 is its least-cost via.

Through successive iterations of the conflict resolving algorithm in comparison with the established shortest-path or least-cost baselines established in FIG. 4A, the resulting end product should be as seen in FIG. 4B, wherein a flow via 406 has vias that are each only connected to one net. Meaning that net A of component 402 should be connected to a via that is also connected to a net A of component 404 of FIG. 4A. Thereby, flow via 406 has a clean routing without any electrical misconnections. Moreover, the routing of the individual flow lines are clean, evenly matched, and able to provide beneficial signal characteristics.

Figure 5:
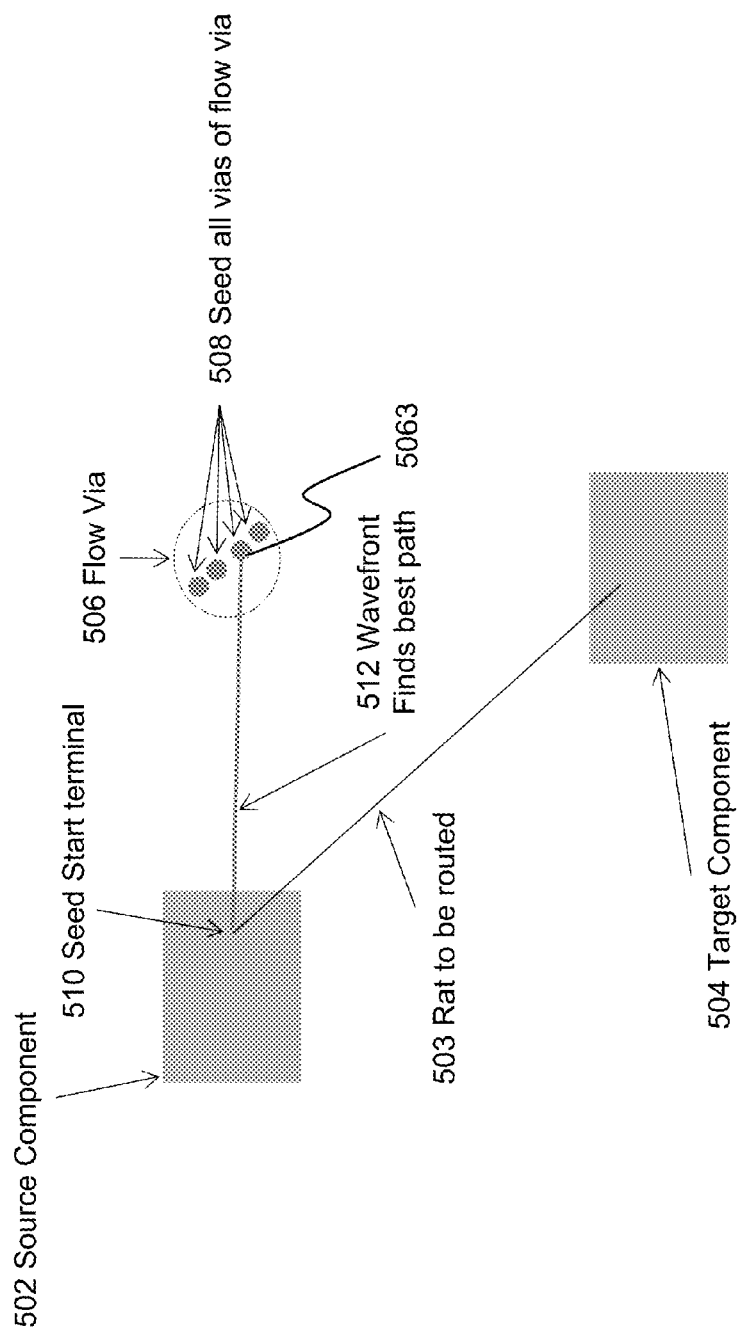
FIG. 5 is a schematic view of an initial exemplary simplified step of an auto router in-progress in accord with an exemplary embodiment of the present invention.

As seen in FIG. 5, a source component 502 is connected to a target component 504. The rat to be routed 503 shows an interconnection between a first terminal of source component 502 and a terminal of target component 504. With the aspirational rat to be routed 503, a flow via 506 is established having a plurality of vias 508 which are initially seeded as target vias. The start terminal is seeded at 510 and a wavefront or cross resolving shortest-path or least-cost routing method (used interchangeably herein) seeks out and finds a shortest-path to connect with via 5063. The start terminal 510 could have found any of the other vias to be the least cost; however, it found 5063 to be the least cost in this particular case.

Figure 6:
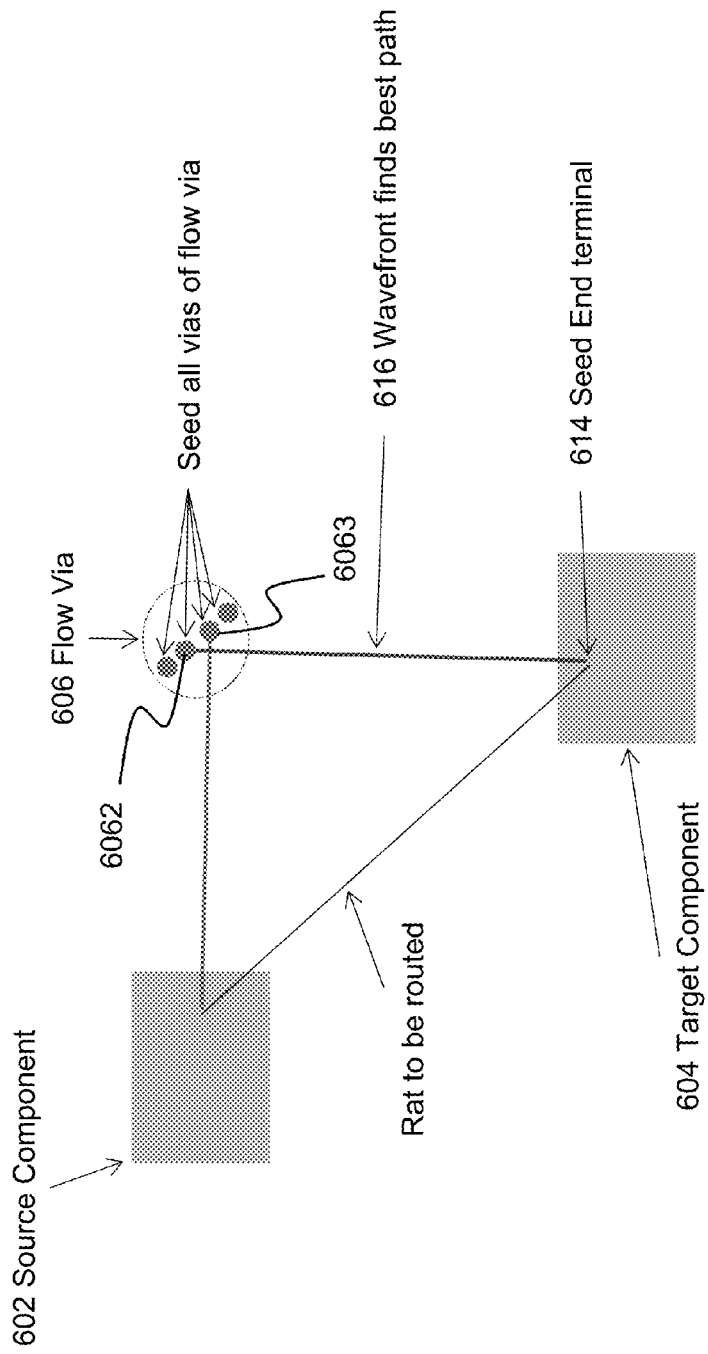
FIG. 6 is a schematic view illustrating a further step in the exemplary auto routing in accord with an exemplary embodiment of the present invention.

As seen in FIG. 6, the end terminal is seeded at 614 and all of the vias of the flow via 606 are seeded at 608 as targets. The wavefront finds the best path 616 which happens to connect to via 6062. While it is seen that the end terminal 614 connects via rat 616 to via 6062 and the source terminal of source component 602 connects to a different via, via 6063, thereby resulting in two disconnects or opens, this electrical misconnection is not prohibitive at this point. Rather, the shortest or best path for each of the connections is merely recorded with a corresponding cost metric.

Figure 7:
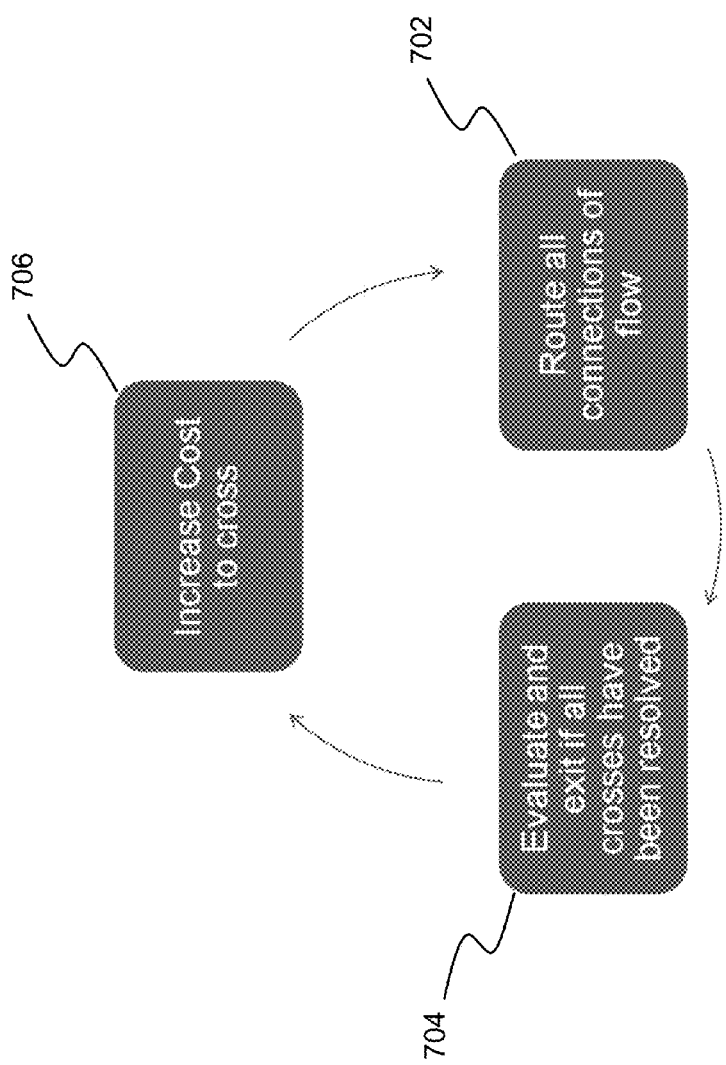
FIG. 7 is a highly simplified illustrative flow diagram illustrating an exemplary embodiment of the present invention.

As seen in FIG. 7, all connections of the flow are routed at 702, an evaluation of whether all of the crosses have been resolved is performed at 704 and if so, the process stops. However, if indeed crosses still exist, then the flow progresses to block 706 which increases the cost of the cross condition so as to penalize electrical crosses and the cross resolving method will then compare the cost of the cross vs. the cost of another maybe less optimal path. Thereby, a tradeoff between a shortest-path and the overall least-cost (including the cross-cost) is achieved and an optimal arrangement of connections between source terminals, vias, and target terminals is thereby reached.

Figure 8:
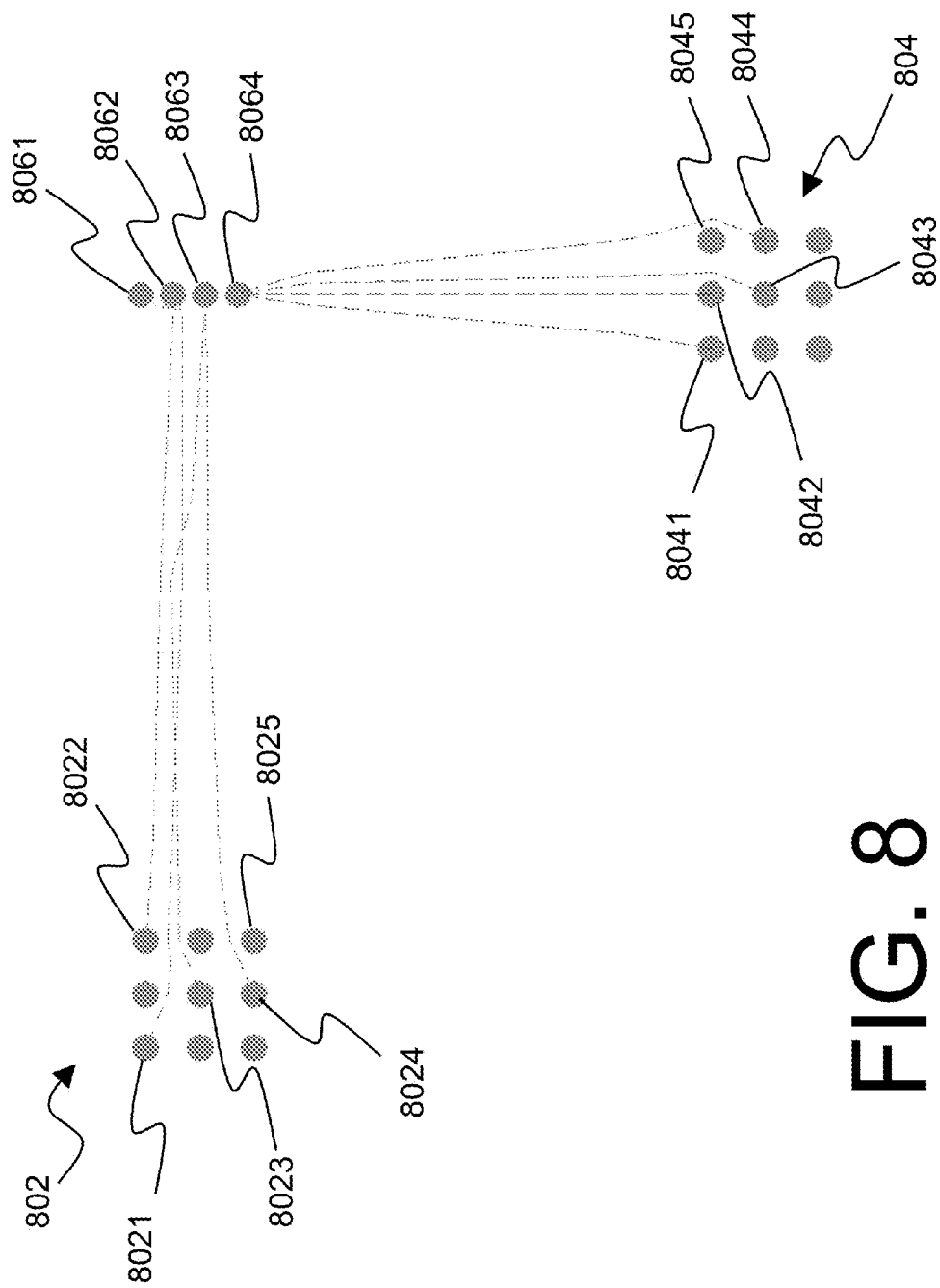
FIG. 8 is a schematic view of a simplified exemplary stage of the auto routing in accordance with an exemplary embodiment of the present invention.
Figure 9:
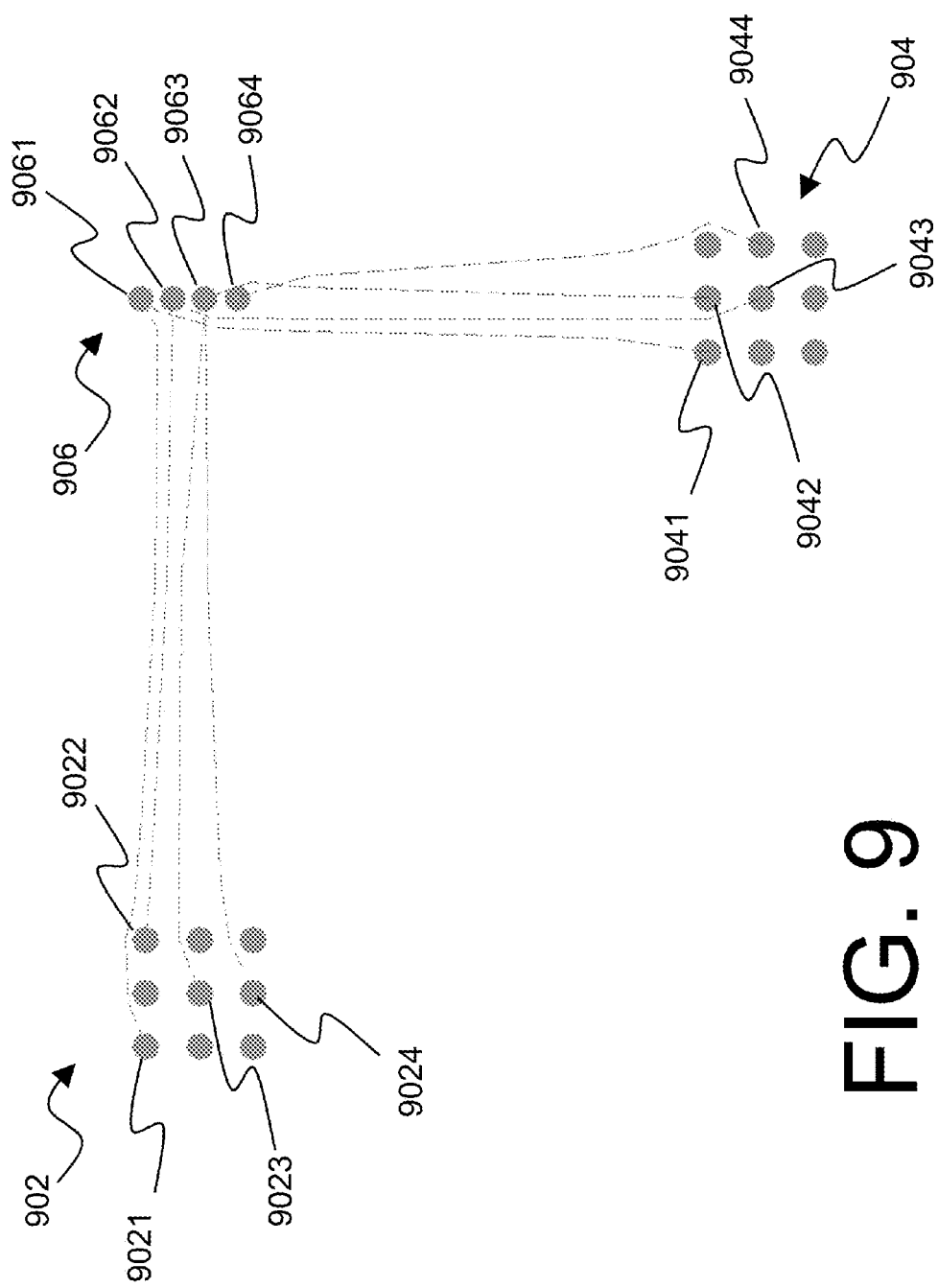
FIG. 9 is a schematic view illustrating a further stage of the auto routing in accord with an exemplary embodiment of the present invention.

FIG. 8 illustrates an actual reduction to practice of an exemplary embodiment harnessing the iterative cross conflict resolution methodologies as described herein. A first set of terminals 802 is attempting to be connecting to a second set of terminals 804 on a different layer and thus requires an intermediate flow via 806. Alternatively, it may merely be advantageous in a least-cost calculation to traverse different layers of the design to interconnect the first and second set of terminals 802 and 804. Flow via 806 has a plurality of vias 8061-8064 arranged in a vertical orientation for providing such a traversal of design layers. A first terminal 8021 is attempted to be routed to any of the vias 8061-8064. In this instance, via 8061 has been chosen as the least cost via. Subsequently, terminal 8041 is attempted to be connected to any of the vias 8061-8064. In this instance, via 8064 has a plurality of initial-iteration-connections from end terminals 8041-8045 as the preferable via based on predetermined criteria including, potentially, shortest-path.

Terminal 8022 is then attempted to be connected to any of the vias 8061-8064 and in this instance, via 8062 has been identified as the least-cost via. It is important to note that there may exist an infinite number of paths between terminal 8022 and via 8062 and the path-finding methodology as described herein may, in the absence of other factors, instructions, or other constraints, choose a most-direct route. However, a plurality of user input, factors, constraints, groupings, and design rules may influence or change the straightest or most direct route due to such conflicts as an obstacle, a lack of occupancy between other components, and the like. Indeed, it is important to note that while FIG. 8 may appear to be a completely empty design, in reality, there may be hundreds or even thousands of components littered about the design. Indeed, the design may not have a square or rectangular shape, but may indeed be of any polygonal shape or may be even arcuate, circular, or irregular in some instances. Further, there may be cut-out sections, such as to accommodate a battery or other component. Therefore, it is important to note that simply the shortest-path may not result in a routable path.

Thereafter, target terminal 8042 is attempted to be routed to any of vias 8061-8064 and indeed via 8064 has been chosen as the lowest-cost via. Terminal 8023 is then attempted to be routed to any of the seeded terminals 8061-8064 and in this instance, via 8063 has been selected. Terminal 8043 is then mated with via 8064. Terminal 8043 is then mated with via 8064. Terminal 8024 is then attempted to be mated with any of vias 8061-8064 and indeed via 8063 has been selected as the least-cost. While this may create an electrical misconnection between terminal 8023 and 8024, at this iteration of the method, such crosses are allowed through a zero or very low cost for crosses. Therefore, it is deemed more important at this stage to fully explore all (or at least not limit) possible solutions which will then be recorded into the data model or database for later evaluation and comparison between crossing costs as opposed to taking a more circuitous or roundabout route.

It may be seen that some terminals do not need to be routed or are not routed through this via but may be routed through a separate via. Alternatively, some of the terminal pins may be empty, dummy, or used for test purposes only, and so it is shown, illustratively, that terminal 8025 is unconnected. Circuit routing diagram 906 shows a further iteration or progression through the crossing conflict methodology. As crosses existed in FIG. 8 upon completion of the initial round of routing, a crossing cost or electrical misconnection penalization has been introduced or at least increased since the iteration of FIG. 8. Thereby, it is seen that terminal 9021's connection to via 9061 has taken a different route and proceeds above the other terminals within the set of terminals 902 while it appears that terminal 902 has still found via 9061 to be the least expensive via to connect to. Similarly, terminal 9022 has maintained its connection with via 9062. Terminal 9023 has chosen via 9063 as its least cost terminal, and terminal 9024 has chosen via 9063 as well. Therefore, at least one cross still exists between terminals 9023 and 9024 where they both meet crossing two separate nets at one via 9063.

Terminal 9041 has found a balance between the shortest-path and the penalization of electrical misconnections and has resultantly chosen via 9061 rather than via 9064 which is of course the shortest path therebetween. Likewise, terminal 9042 has been correspondingly mated with via 9063, again striking a balance between electrical misconnection and shortest-path. Similarly, terminal 9043 has chosen via 9062. Thereby, what was initially a cluster of terminals 9041-9044 all choosing via 9064 has been rearranged such that there is now 1:1 (one to one) correspondence between target terminals and vias.

Figure 10:
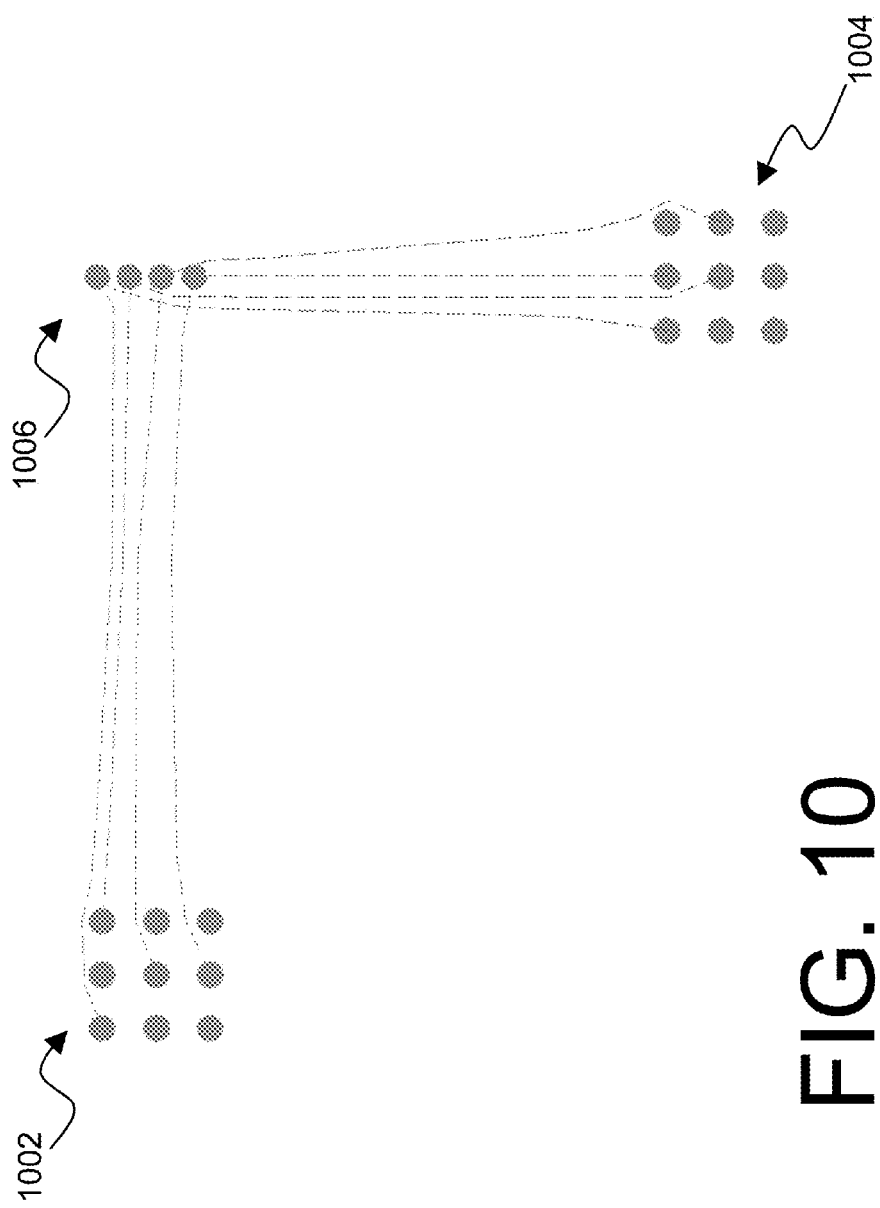
FIG. 10 is a schematic view of another stage of an exemplary auto routing in-progress in accordance with an embodiment of the present invention.

FIG. 10 shows a Circuit diagram of a further iteration of the cross conflict resolution method whereby crossing is allowed, but the cost thereof is increased successively through iterations. Accordingly, each of the terminals within the first set of terminals 1002 and the second set of terminals 1004 have increasingly chosen different vias 1006 while still maintaining a least-cost approach from a holistic or total view of the balancing of all costs to be a cheapest overall amongst all of the different terminals.

Figure 11:
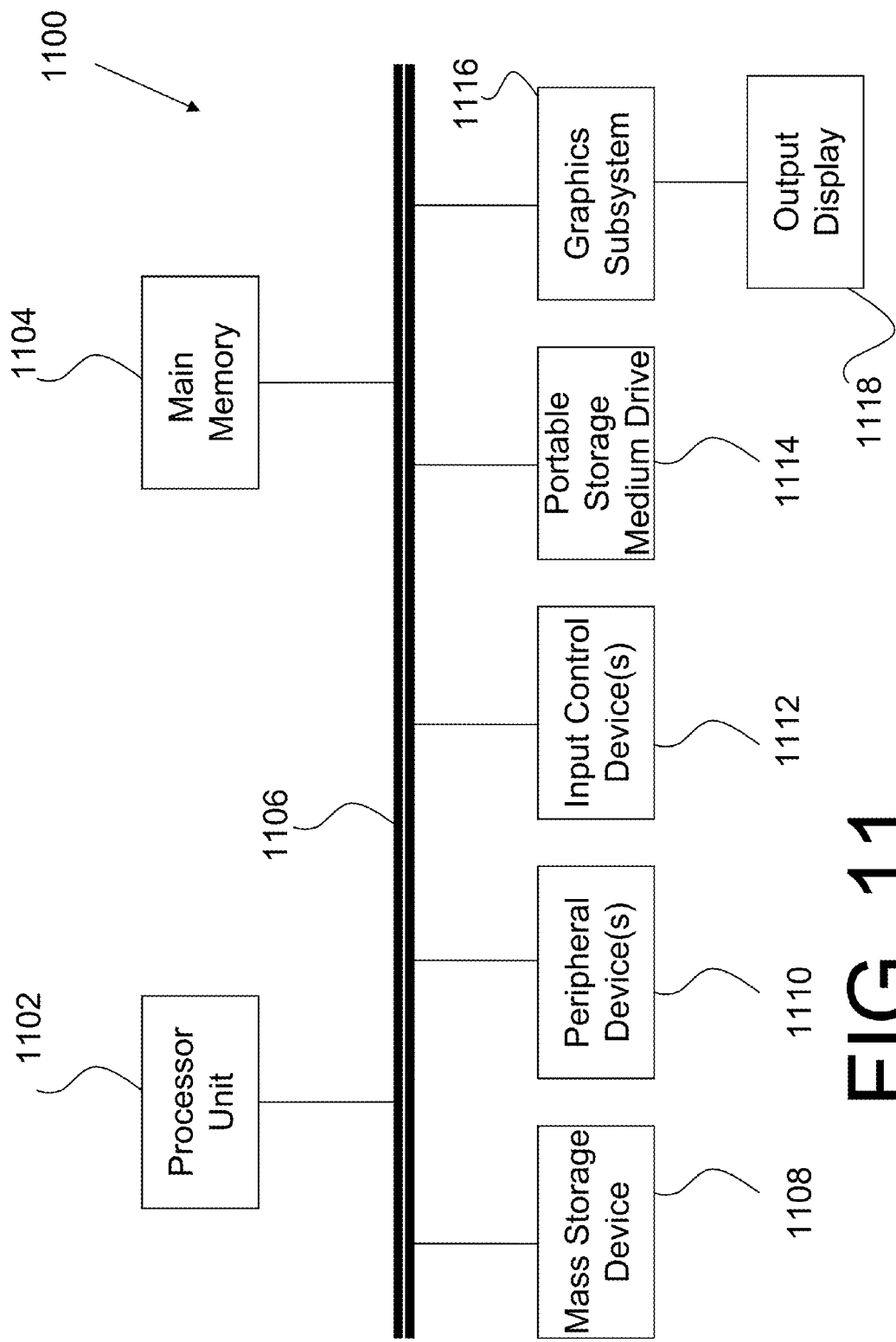
FIG. 11 is a block diagram illustrating an exemplary interconnection of components in a processor-based system for implementing an exemplary embodiment of the present invention.

FIG. 11 illustrates a block diagram of a computer system for executing electronic design automation, layout generation, auto routing, pathfinding, cost optimization, and electrical connection, in accordance with various embodiments of the present invention. A computer system 1100 contains a processor unit 1102, a main memory 1104, an interconnect bus 1106, a mass storage device 1108, peripheral device(s) 1110, input control device(s) 1112, portable storage drive(s) 1114, a graphics subsystem 1116, and an output display 1118. Processor unit 1102 may include a single microprocessor or a plurality of microprocessors for configuring computer system 1100 as a multi-processor system. Main memory 1104 stores, in part, instructions and data to be executed by processor 1102. Main memory 1104 preferably includes banks of dynamic random access memory (DRAM) as well as high-speed cache memory.

For the purpose of simplicity, the components of computer system 1100 are connected via interconnect bus 1106. However, computer system 1100 may be connected through one or more data transport means. For example, processor unit 1102 and main memory 1104 may be connected via a local microprocessor bus and mass storage device 1108, peripheral device(s) 1110, portable storage medium drive(s) 1114, and graphic subsystem 1116 may be connected via one or more input/output (I/O) busses. Mass storage device 1108, which may be implemented with a magnetic disk drive, an optical disk drive, a solid state device, an attachment to network storage, and the like, is preferably a non-volatile storage device for storing data, databases, and instructions, to be used by processor unit 1102. In a software embodiment, mass storage device 1108 may store the software to load it into main memory 1104.

Portable storage medium drive 1114 operates in conjunction with a portable non-volatile storage medium such as a floppy disk, a compact disk read only memory (CD-ROM), or a digital versatile disk read only memory (DVD-ROM), to input and output data and code to and from the computer system 1100. In one embodiment, the software is stored on such a portable medium, and is input to computer system 1100 via portable storage medium drive 1114. Peripheral device(s) 1110 may include any type of computer support device such as an input/output (I/O) interface, to add additional functionality to computer system 1100. For example, peripheral device(s) 1110 may include a network interface card to interface computer system 1100 to a network.

Input control device(s) 1112 provide a portion of the user interface for a computer system 1100 user. Input control device(s) 1112 may include an alphanumeric keypad for inputting alphanumeric and other key information; and a cursor control device such as a mouse, a track pad or stylus; or cursor direction keys.

In order to display textual and graphical information, computer system 1100 contains graphic subsystem 1114 and output display(s) 1118. Output display 1118 may include a cathode ray tube (CRT) display, liquid crystal display (LCD), plasma display, projector, or the like. Graphic subsystem 1116 receives textual and graphical information and processes the information for output to display 1118.

In a software implementation, the EDA software includes a plurality of computer executable instructions, to be implemented on a computer system. Prior to loading in the computer system, the EDA software may reside as encoded information on a computer-readable tangible medium such as a magnetic floppy disk, a magnetic tape, CD-ROM, DVD-ROM, flash memory, or any other suitable computer readable medium.

In a hardware implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 12:
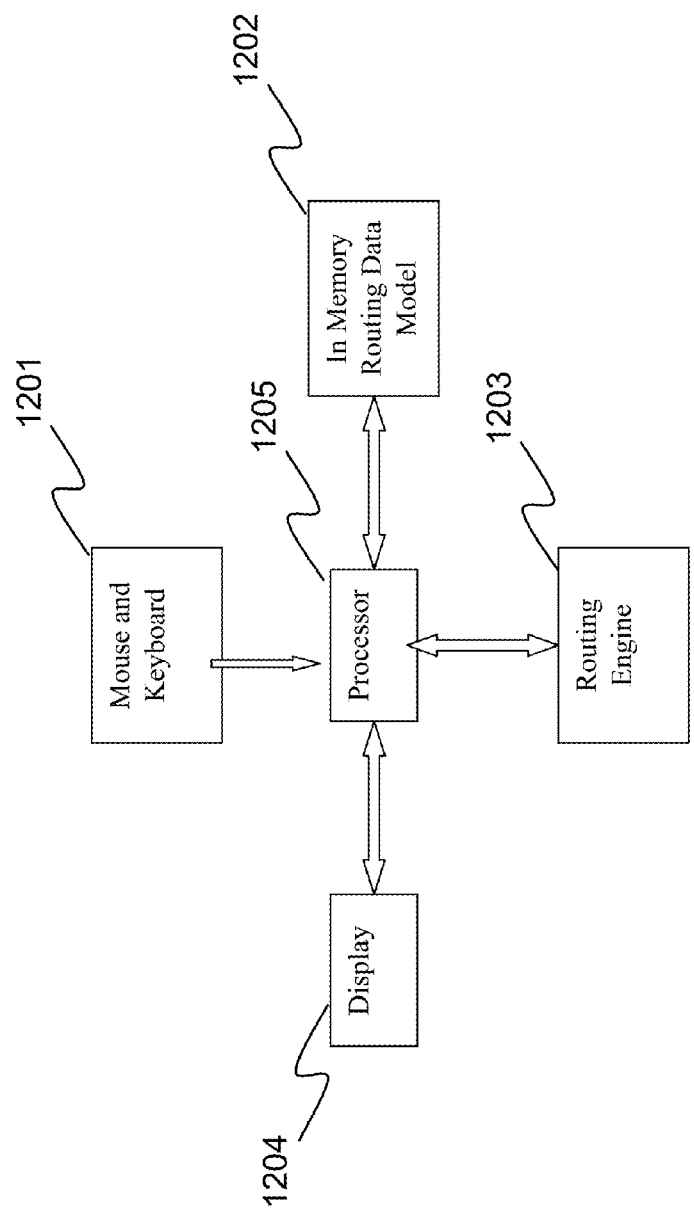
FIG. 12 is another block diagram illustrating another exemplary interconnection of components in a more simplified fashion of a processor-based system for implementing an exemplary embodiment of the present invention.

As seen in FIG. 12, a simplified block diagram of a processor-based system for implementing the automatic routing as disclosed herein is shown. A user display 1204 may display the results of the automated routing and the completely or partially routed circuit diagram to a user. Also, display 1204 may be used initially for a user to set predefined via and flow via location on the circuit design. A user may utilize an interface with a mouse and keyboard 1201 to physically control a cursor on the screen and thereby manipulate and control via and flow via location. Additionally, a user may utilize bundles and/or flows to control the routing of rats, or flow lines. Memory 1202 may maintain the data model or database of net lists, circuit design, and the data model of costs for each of the connections between terminals and vias. Additionally, the fully routed physical layout of the circuit design may be stored in the data model 1202 as well. A routing engine 1203 is operatively coupled to processor 1205. Processor 1205 may be a single processor or may be a multi-core or a multi-processor system or may even indeed be an entire server farm of blade servers or the like. Routing engine 1203 may be a specialized hardware co-processor, analogous or similar to a GPU (graphical processing unit), a math co-processor, or a physics co-processor, and the like, or routing engine may indeed be encompassed within processor 1205.

Figure 13:
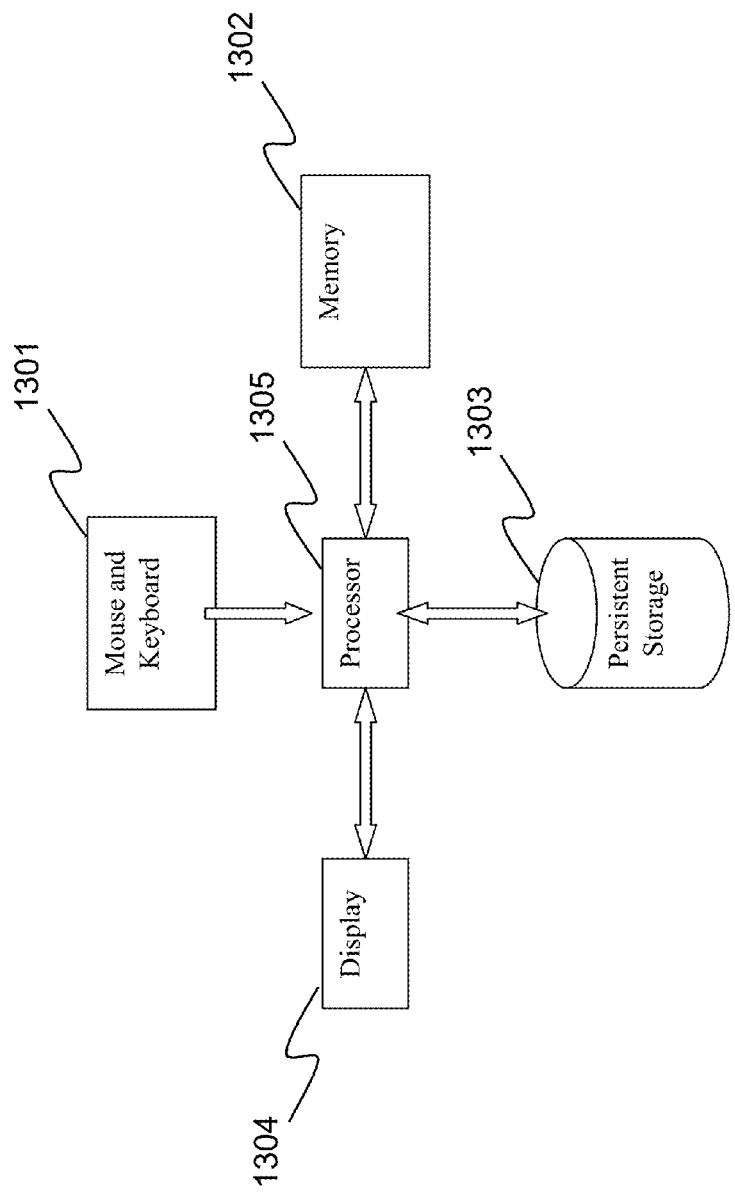
FIG. 13 is yet another block diagram illustrating an exemplary interconnection of components in a simplified fashion for a processor-based system for implementing an exemplary embodiment of the present invention.

FIG. 13 shows another simplified block diagram of a system for executing an EDA software which may include an auto-router including a method as described illustratively herein. A display 1304, mouse and keyboard 1301, memory 1302, and persistent storage 1303 are all operatively inter-coupled with processor 1305.

Figure 14:
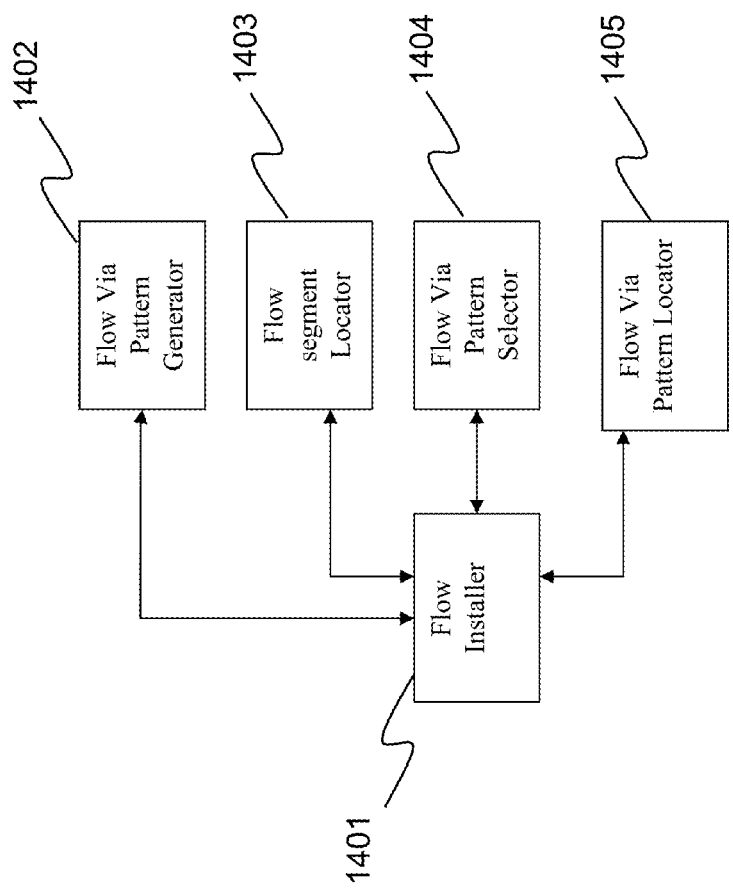
FIG. 14 is another block diagram illustrating an exemplary interconnection of components in a system for implementing an exemplary embodiment of the present invention.

FIG. 14 shows a functional block diagram of interoperability between a flow installer 1401 which generally lays flows between components (or sets of terminals) and intermediate vias. A flow via pattern generator 1402 communicates with the flow installer 1401 and is primarily used to create new flow via patterns of vias within the flow via to meet particular customer demands, needs, or design requirements. For example, the flow via pattern generator may generate a new flow via pattern to include a plurality of unassociated or unassigned vias in a certain proximity or layout relative to, for example, a ground and/or a power via. A flow segment locator 1403 is in communication with the flow installer 1401 and may, for example, either allow a user, or a method in accordance with various illustrative embodiments herein, to automatically, or manually locate flow segments in the circuit design. Such a locator may be actuated responsive to user indications of preferred flow locations and may (unless certain predetermined criteria are met) follow that user instruction. However, if the cost is too high, or if a design rule (such as a lack of vacancy between obstacles based on certain minimum spacing requirements) or constraint would be violated, then the flow segment locator 1403 may choose an alternate path, preferably responsive to a least-cost consideration.

Flow via pattern selector 1404 operatively communicates with flow installer 1401 and, for example, allows a user to select a predetermined pattern of flow via. Such a flow via pattern may include a plurality of unassociated vias, and may also include a power and/or ground or the like. Such predetermined or predefined flow via patterns may be provided stock or by default from an EDA company, or may be previously created and saved flow via patterns created by an end user or third party. Flow via pattern locator 1405 is operatively coupled to the flow installer 1401 and may serve several different functions, such as searching for a predetermined flow via pattern based on certain specified criteria, such as, for example: "find *ground*" or "find diagonal." Alternatively, the flow via pattern locator may allow for a user to specifically place a flow via pattern on a circuit design.

Figure 15:
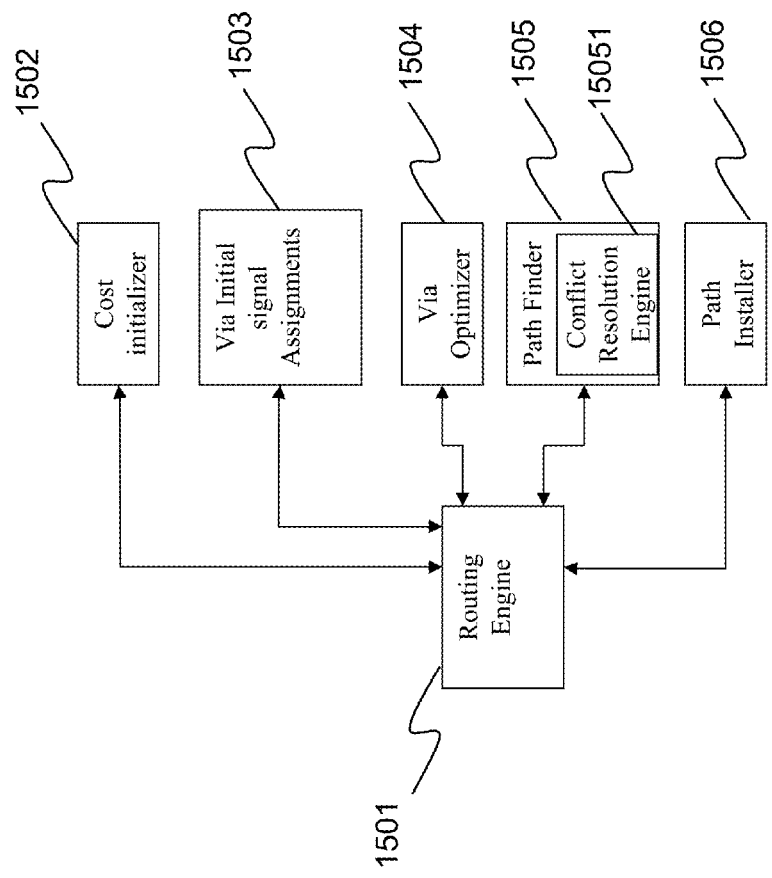
FIG. 15 is still another block diagram illustrating another exemplary interconnection of components in a routing engine system for implementing an exemplary embodiment of the present invention.

FIG. 15 shows a simplified block diagram of functional components interconnected with a routing engine 1501. A cost initializer 1502 may serve many functions, but primarily serves to initialize the cost of crossing or conflicts at zero or a very low cost. Additionally, cost initializer 1502 may establish a geometric cost metric from a set of criteria (preferably including distance or path length, but also, potentially turns, related proximities, relevant design rules, constraints, adherence to intended flow path, or the like). This thereby establishes an initial relation between a geometric cost and a crossing or conflict cost. Alternatively, as would be known to one of skill in the art, the costs may remain fixed, but may be multiplied by an importance/priority factor such as (0, 0.10, 0.5, 0.8, . . . 1). Initially, geometric cost should be prioritized and only after least-cost geometric paths have been thoroughly explored and recorded should a crossing cost become higher priority. Cost initializer 1502 may be called subsequently at each iteration to increase step-wise (or otherwise) the cost of crosses.

Via initial signal assignments 1503 communicates operatively with the routing engine 1501 and may maintain a listing or definition of assigned or intended terminal-to-via (or terminal-to-terminal) connections. For example, the via initial signal assignments block 1503 may maintain an exclusionary list of ground and power vias to ensure signals are not routed thereto. Additionally, Via initial signal assignments unit 1503 may allow for an assignment of nets and their terminals to vias to thereby allow a designer to manually specify predefined connections. Further, Via initial signal assignments unit 1503 may establish preliminary assignments between terminals and vias which may be refined later through successive iterations. Such preliminary assignments between terminals and vias may be based on merely the geometric costs which may be used to automatically generate a set of shortest-path assignments between terminals and vias. A shortest-path assignment for each of the terminals to a via establishes a baseline cost which may be recorded for later comparison or evaluation against an increasing crossing cost to determine which assignments are the cheapest to regenerate or reroute between conflicting assignments.

A via optimizer 1504 communicates operatively with routing engine 1501 and may serve to allow a user to rearrange, relocate, or reassign vias within a flow via into a more preferable or optimized pattern responsive to the physical layout of the terminals of either the source or the target set of terminals. Additionally, the vias may be rearranged for more beneficial signal propagation—such as when dealing with differential pairs to reduce crosstalk, interference, noise emission/acceptance, or to achieve impedance matching. Via optimizer unit 1504 may allow for selection of predefined patterns of vias in a flow via as discussed above.

Path finding module 1505 operatively communicates with routing engine 1501 to provide an optimal, least-cost, or shortest-path route between terminals and vias. Path finder 1505 also considers routing paths around, under, or over components as necessary to circumvent an obstacle, the capacity between obstacles, the occupancy, and the ability for all rats within a bundle to follow the same route between obstacles. It may be that the vacancy (capacity minus existing occupancy) between two obstacles is not wide enough to allow for all of the rats within the flow or bundle to pass therethrough. In this case, it may be that the specified flow by the user is deviated from and one of the rats passes around an outside of one of the obstacles while the remainder of rats fill up the vacancy between the obstacles and pass therethrough. Path finder 1505 may be cognizant of design rules and constraints limiting the distance between rats, the distance between a rat and a component, and the like. A huge number of constraints and design rules may be imposed and path finder 1505 may be charged with maintaining and complying therewith.

Path finder 1505 may also contain a routing conflict engine or conflict resolution engine 15051. Conflict resolution engine 15051 may be executed in the case of a cross, disconnect, or other similar electrical misconnections. Conflict resolution engine 15051 may trigger an increasing cost for crosses by triggering cost initializer 1502. By not initially triggering the conflict resolution engine 15051, it is seen that the entire universe of different possible paths between a given terminal and a given via to reach another terminal may be explored and each terminal is able to find its most optimal place thereby. While such an approach may not be the most computationally efficient, it is believed that this is offset by the more efficient and optimal end product produced and other benefits thereof.

Upon completion of execution of the conflict resolution engine 15051, path installer 1506, seeing that there are no crosses or electrical misconnections, and assuming that all of the terminals have been successfully routed to the other terminals through the vias, may be executed to finalize the routes thereof into the circuit design. A finished end product thereof may be a fully routed or partially routed circuit design of a circuit board, or integrated circuit. Such a fully routed or partially routed circuit design may then be used as a physical layout, circuit realization, silicon etch mask, or the like in the creation of a physically embodied circuit board, PCB, IC, package, SOC, and the like.

Figure 16:
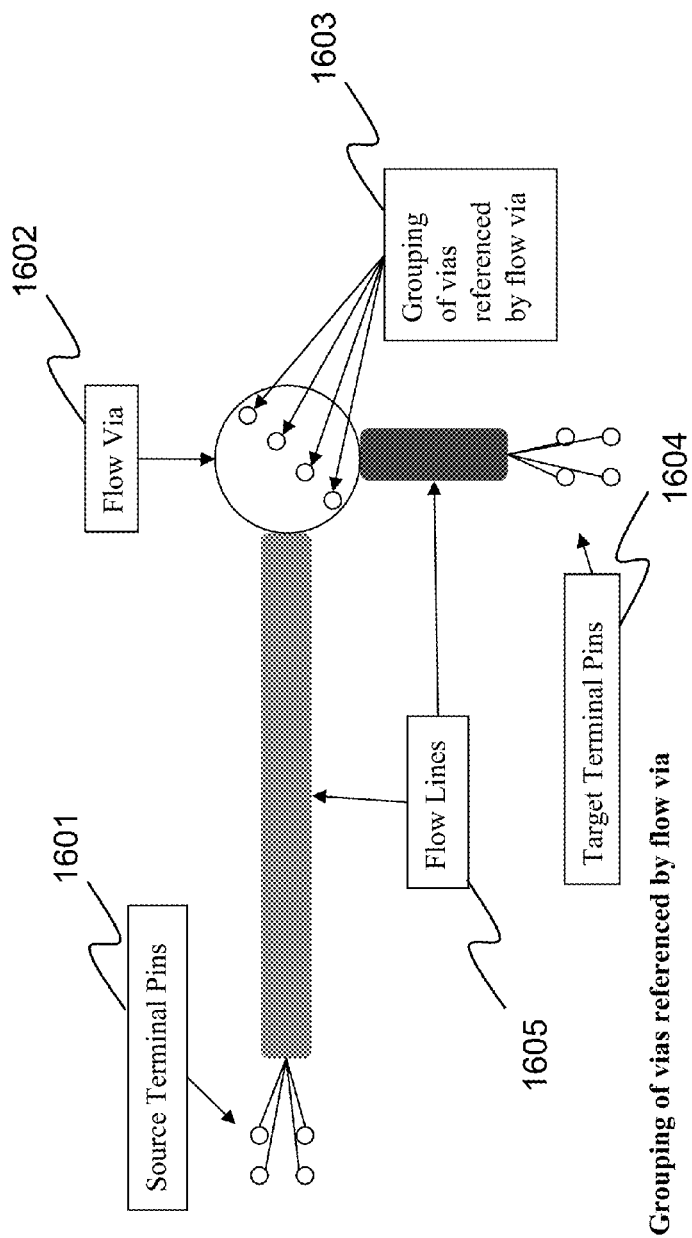
FIG. 16 is a schematic view of an illustrative simplified chart showing an interconnection from a source terminal to a target terminal, being intermediately connected through a plurality of vias referenced as a unitary flow via.

As seen in FIG. 16, a plurality of source terminal pins 1601 are provided and connected to a plurality of target terminal pins 1604 through flow lines 1605 and a flow via 1602 containing a plurality of vias 1603 referenced by the flow via 1602.

As seen in FIG. 17A, a first flow segment 1705A connects through a flow via 1702A to another flow segment 1706A. Flow via 1702A is a relation among vias. As seen in FIG. 17B, flow via 1702B has been illustratively dragged rightward in a placement by a user or automated measures. Accordingly, flow segment 1705B has automatically extended its attachment to remain attached to flow via 1702B. Also, flow segment 1706B has rotated angularly to the right and elongated to maintain its attachment to flow via 1702B. In this manner, the plurality of vias making up flow via 1702B are all collectively manipulable, meaning that they may be moved, rotated, relocated, or any such action performed thereon. Additionally, items or elements that connect to the flow via 1702B, such as flow segment 1705B and flow segment 1706B may also move responsive to the movement of the flow via 1702B to maintain a connection thereto.

Figures 18A, 18B:
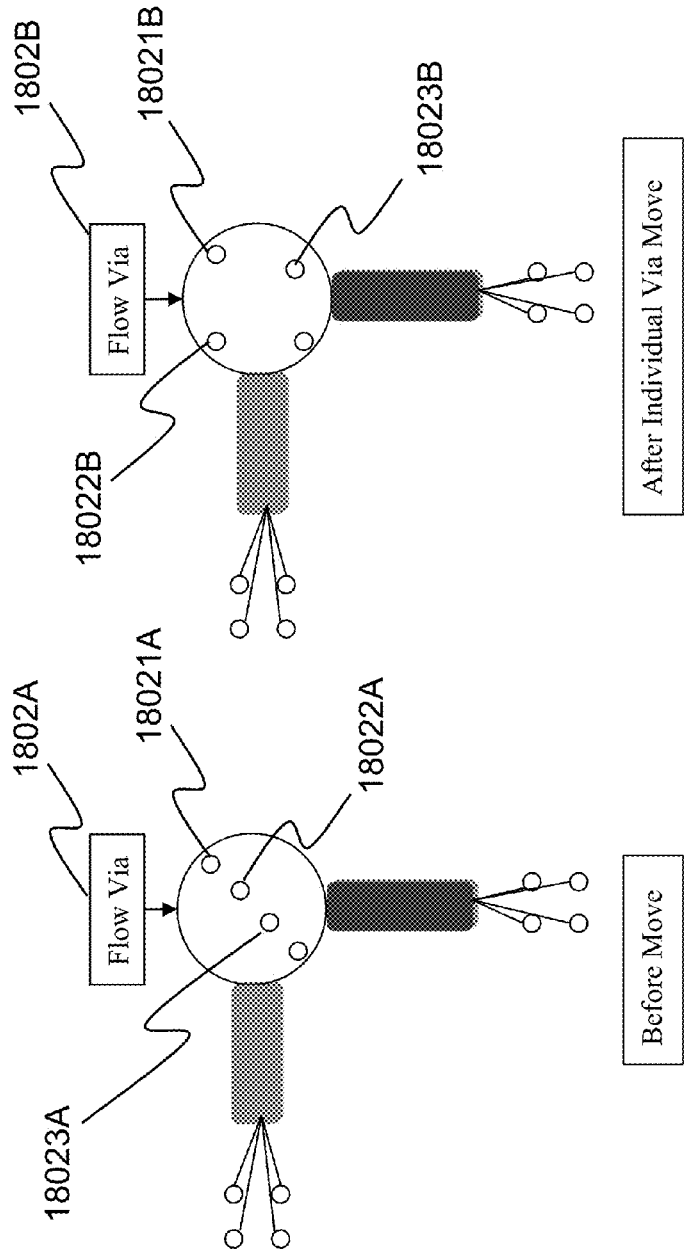
FIG. 18A is a schematic view showing an exemplary simplified arrangement of a predetermined flow via pattern.
FIG. 18B is a schematic view showing an exemplary user manipulation of the individual vias of the flow via into a new pattern which may be more suitable towards certain design objectives.

FIG. 18A shows flow via 1802A with a plurality of vias 18021A, 18022A, and 18023A, arranged in a rightward upwardly sloping diagonal pattern. Such a pattern may be a predefined flow via pattern as provided by an EDA software developer, and if the predefined flow via pattern as seen in 1802A did not suit the particular user's needs, the user may rearrange, move, or reorganize the via pattern within the flow via 1802A. Such an exemplary reorganization is seen in FIG. 18B. Reorganized flow via 1802B shows via 18022B being moved from the central position of the flow via to an outward upper left periphery and via 18023B being moved to a lower right hand periphery. Such a movement may be responsive to a desire to include a ground and power via in the flow via itself. Any such arrangement of vias may be provided or configured by a user.

Figure 19:
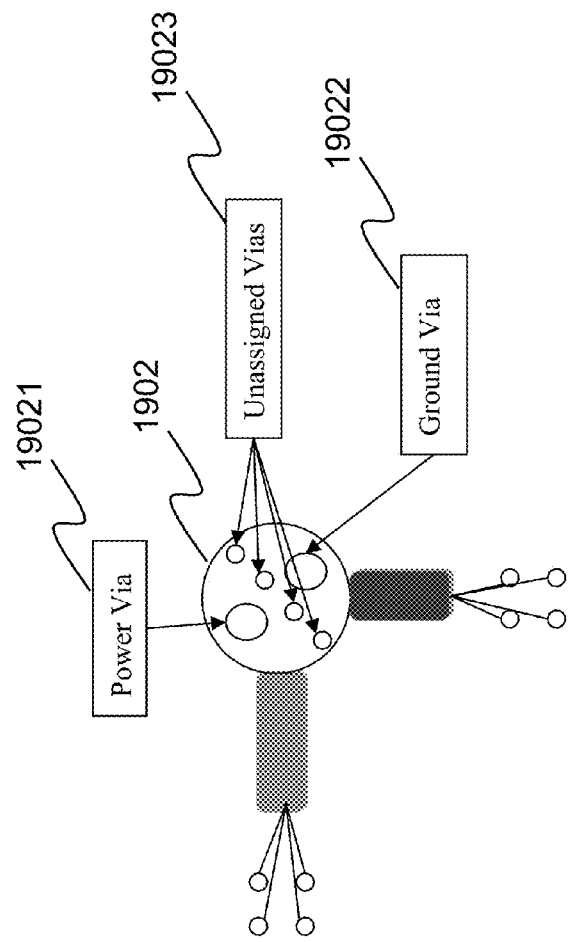
FIG. 19 is a schematic view showing an exemplary simplified layout of a flow via including the intermixing of both power and ground vias therein.

FIG. 19 shows just such a flow via 1902 including both a power via 19021 and a ground via 19022. In addition, unassigned vias 19023 may be used to route flow lines from one layer to another.

Figure 20:
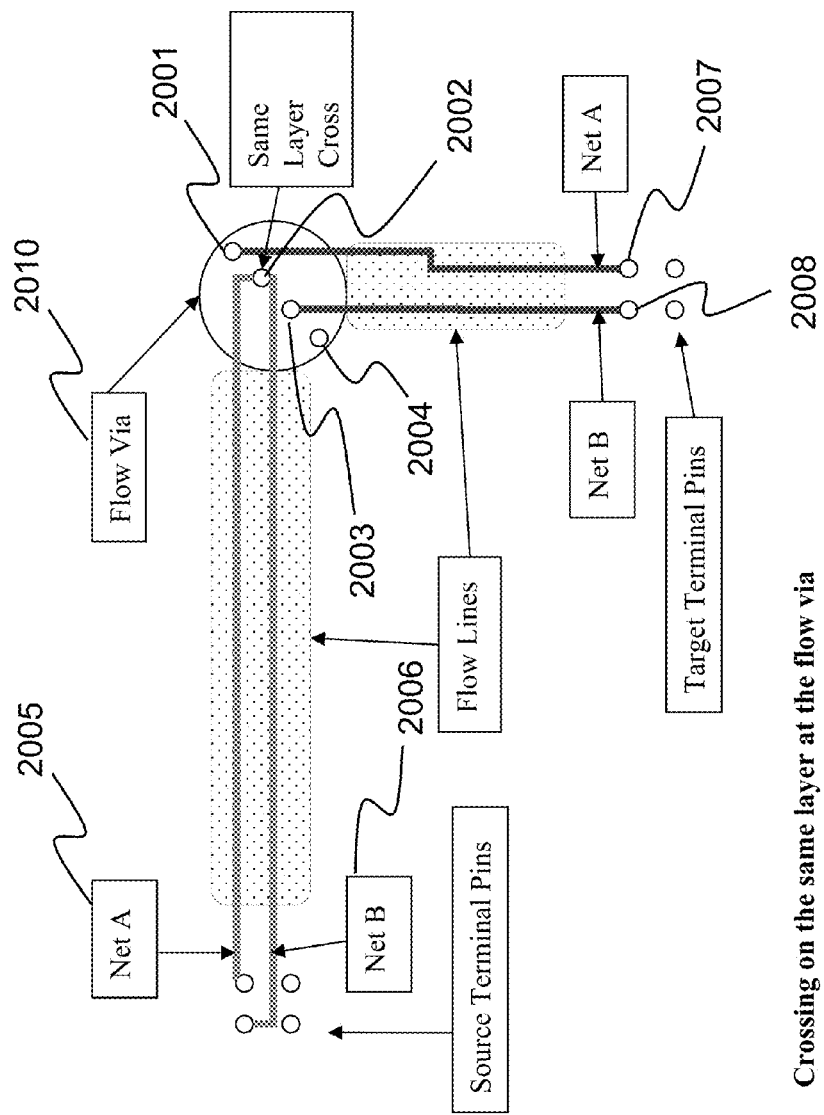
FIG. 20 is a schematic view showing another simplified layout of an interconnection between a first set of terminals and a second set of terminals intermediately meeting at a flow via.

FIG. 20 shows an exemplary stage of the routing from a Net A source terminal 2005 to a target Net A target terminal 2007 through an intermediate flow via 2010. Source terminal 2005 of Net A has been routed to via 2002. The source terminal pin 2006 of Net B has also been routed to the same via 2002. Therefore, it is seen that a cross exists on the same layer as the source terminal 2005 of Net A is intended to be connected to a target terminal 2007 of Net A not a terminal 2008 of Net B. Therefore, a cross exists. Such a cross is permissible at initial stages so as to explore and find the most efficient routing for each of the nets. Such cross will be resolved through subsequent iterations of increasing cost to cross. Additionally, target terminal pin 2008 of Net B has been routed to a via 2003 which results in an open or disconnect as it does not connect to source terminal pin 2006 of Net B. Additionally, a via 2004 has been left unassigned and unrouted. Lastly, target terminal pin 2007 for Net A has been routed to via 2001 which also leaves another open or disconnect.

Figure 21:
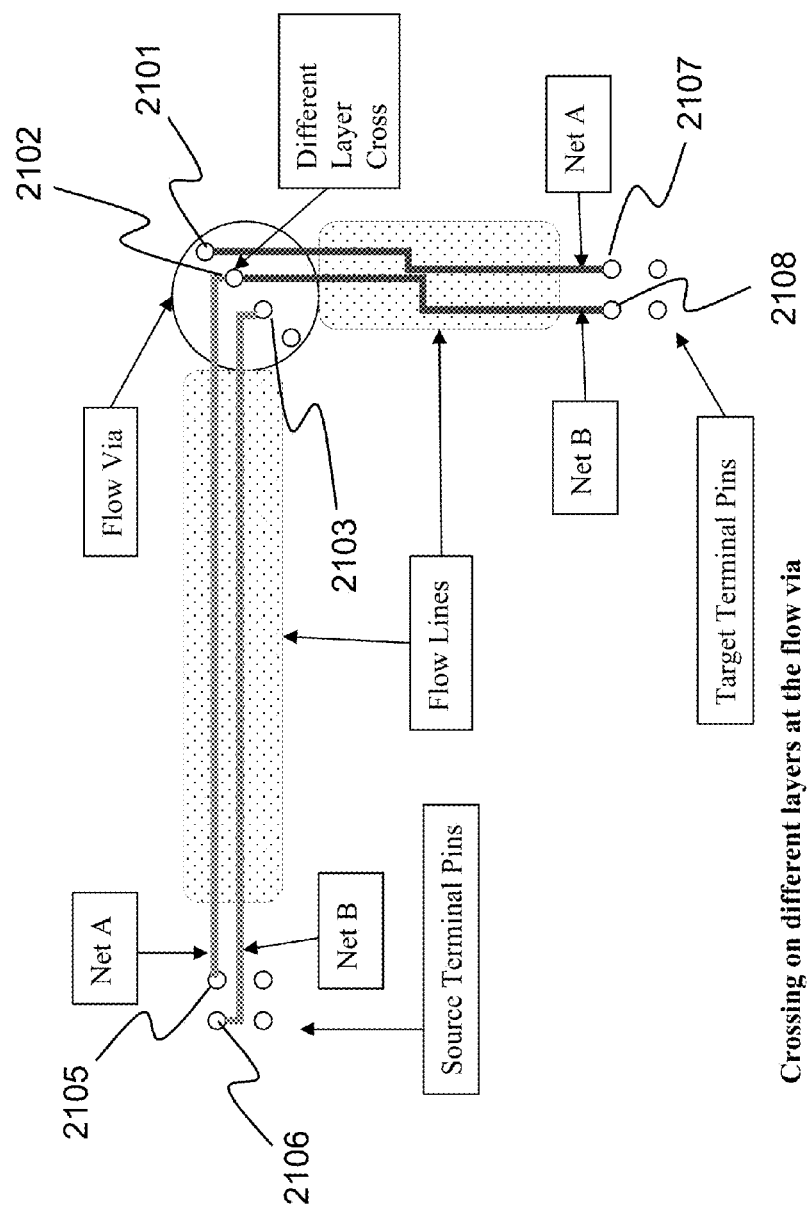
FIG. 21 is a schematic view illustrating a layout having a plurality of electrical misconnections including crosses and disconnects.

FIG. 21 shows a further iteration wherein the source terminal of Net A 2105 and source terminal of Net B 2106 have accordingly been routed to separate vias 2102 and 2103, respectively, thus removing the cross condition that existed in FIG. 20. This removal of the cross condition results from the natural increase of crossing cost through iterations of the conflict resolution method. While it may have been a shorter path from source terminal pin of Net B 2106 to via 2102, it is seen that the increased cost of the cross weighs more heavily than the increased cost of a further distance to via 2103. This can be expressed as: a cost to reroute the Net B is less than a cost to reroute the Net A to a different via. Additionally, it can also be considered as the costs of rerouting from the target terminal pins to the vias. Thus, the cost to reroute source portion of Net B to a different via 2103 must have been cheaper or less expensive in terms of total cost than to either allow a cross or to reroute target terminals of Net B and/or Net A. However, it is seen that target terminal of Net B 2108 has been routed as a least-cost to via 2102, thus causing a cross between layers with source terminal of Net A 2105 which also occupies via 2102.

Figure 22:
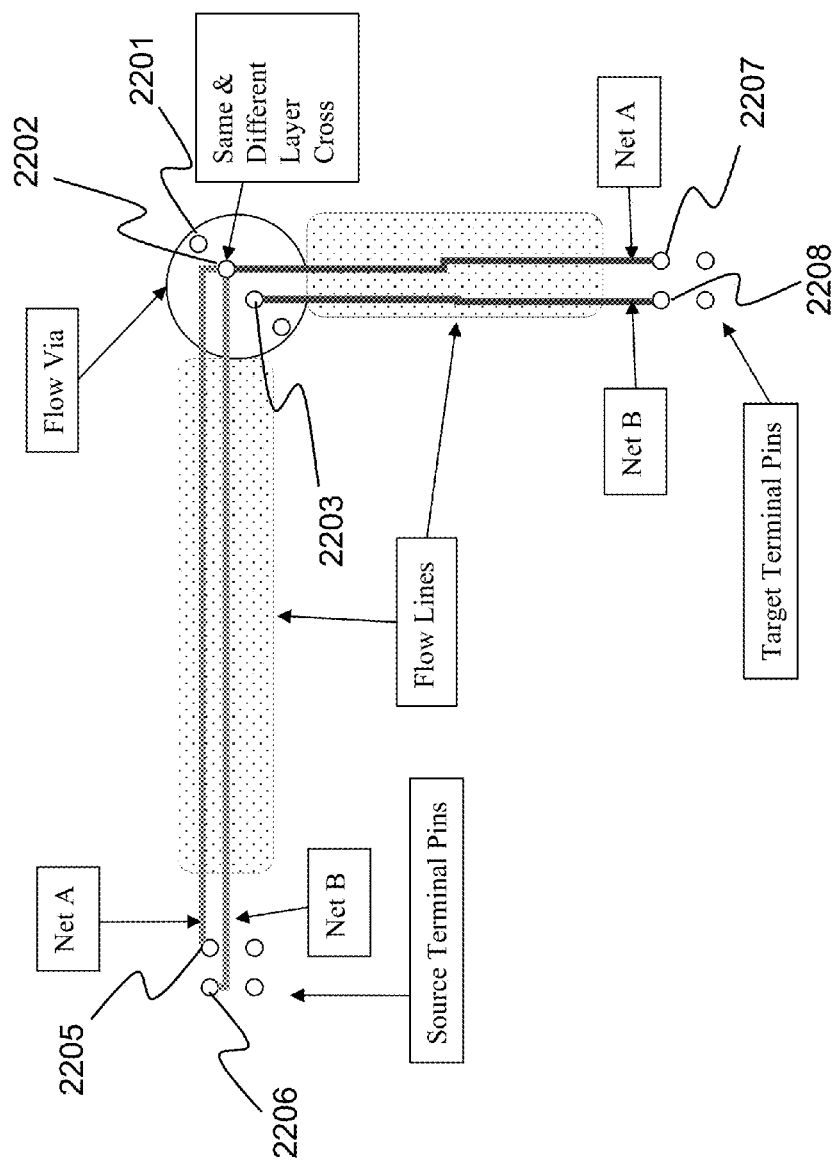
FIG. 22 is a schematic view showing a further simplified layout including illustrative electrical misconnections.
Figure 23:
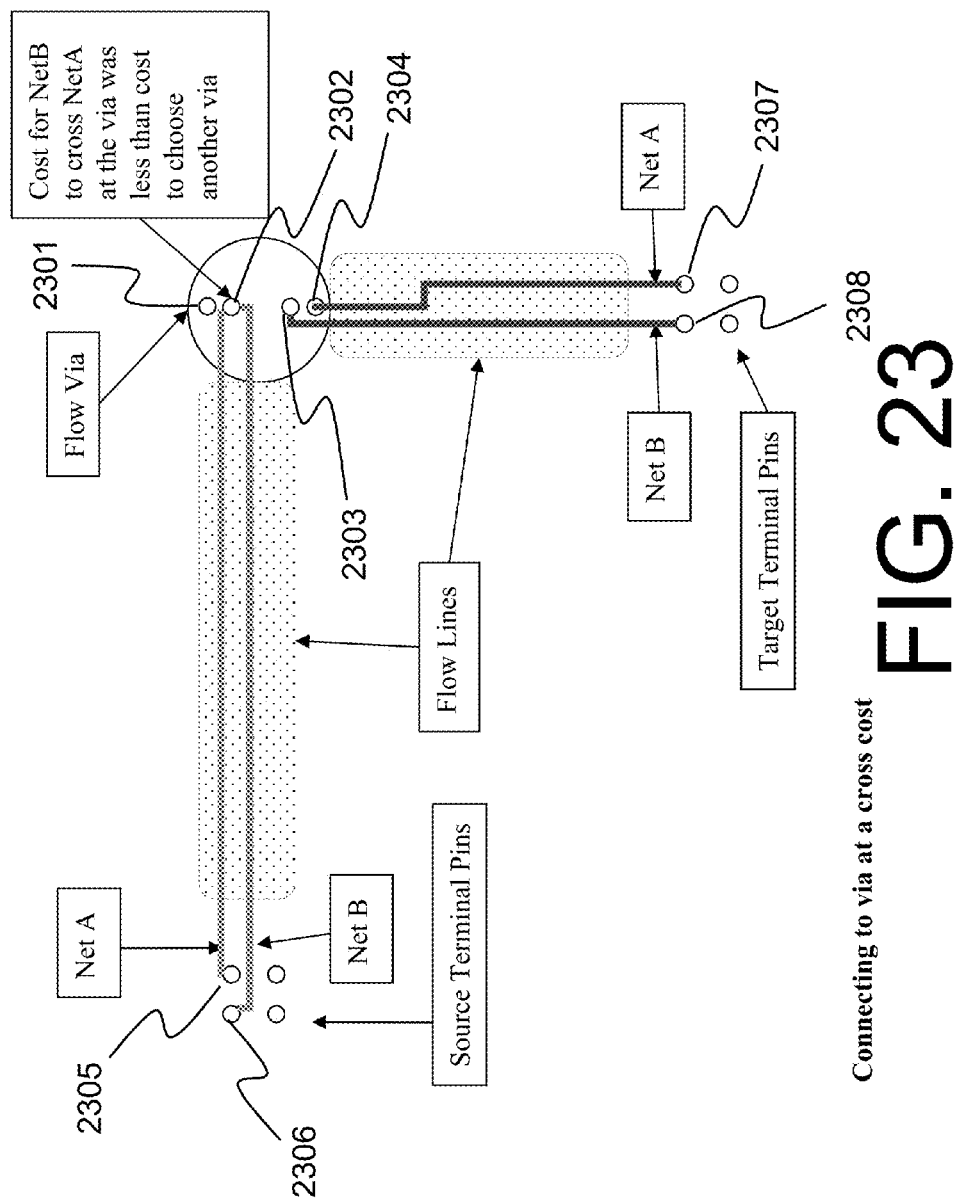
FIG. 23 is a schematic view showing yet another simplified layout showing a plurality of electrical misconnections at the intermediate flow via.

As seen in FIG. 22, source terminal of Net A 2205 now connects to via 2202 creating a same and different layer cross between source terminal of Net B 2206 and target terminal of Net A 2207 which all meet at via 2202. Additionally, target terminal Net B 2208 is routed to via 2203, resulting in an open or disconnect. As seen in FIG. 23, Net A source terminal pin 2305 is routed to via 2302, as is Net B source terminal pin 2306, thus resulting in a cross for Net B and it can be seen that the cost for Net B to cross Net A at the via 2302 was less than the cost to choose another via. Additionally, Net B target terminal pin 2308 routes to via 2303 and Net A target terminal 2307 is routed to via 2304, again resulting in two open or disconnected vias 2303 and 2304.

Figure 24:
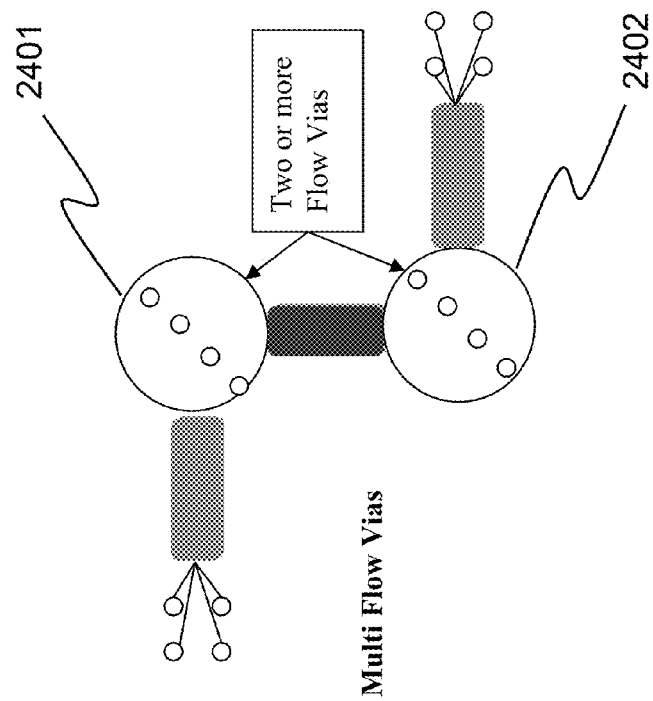
FIG. 24 is a schematic view showing an exemplary simplified layout including a plurality of flow vias disposed intermediate to both a first and second set of terminals.

FIG. 24 shows a plurality of flow vias 2401 and 2402. Indeed, any number, n, of flow vias may be utilized from source terminals to target terminals.

Figure 25:
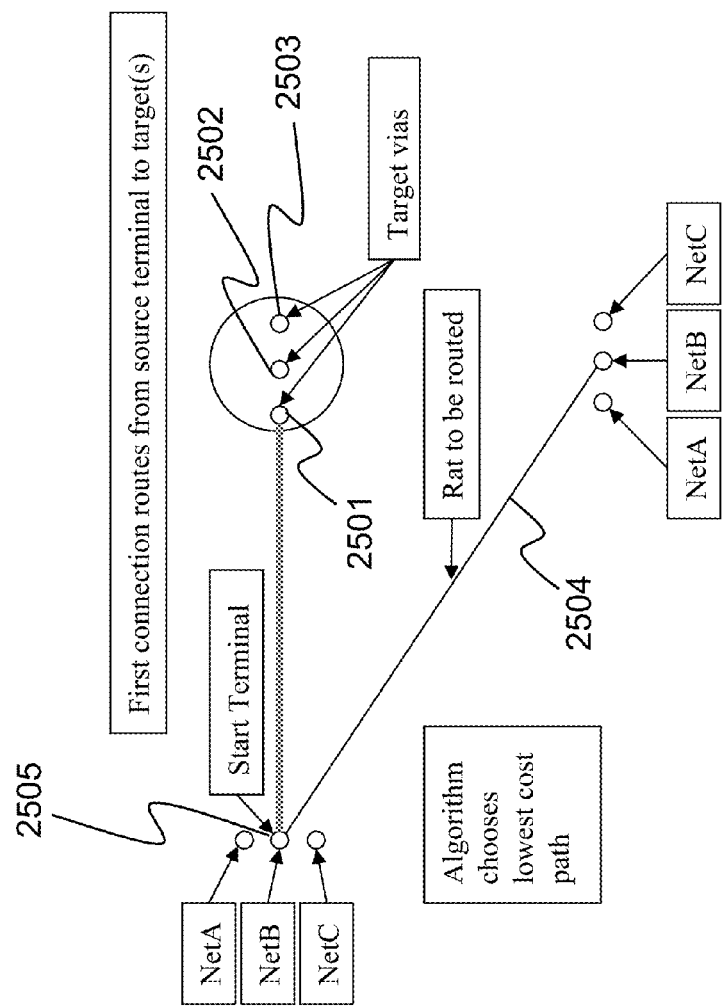
FIG. 25 is another exemplary illustration of a first stage in an automatic routing method in accord with several embodiments of the present invention.

As seen in FIG. 25, a start terminal 2505 of Net B is seeded, as are target vias 2501, 2502, and 2503. A net list maintains a list of intended connections defining a pair of terminals to be interconnected, such as a terminal of Net A to connect to another terminal of Net A, Net B to connect Net B, and Net C to connect to Net C.

Any exemplary netlist may include (in a very simplified form):
Terminal A—Terminal 1
Terminal B—Terminal 2
Terminal C—Terminal 3

Such list of connections need not be maintained in the net list, but may be maintained in any storage medium capable of maintaining a correlation between connections. Indeed, the net list, as shown, is an extremely simplified illustrative version thereof where an actual netlist may maintain a plurality of different pieces of information.

Figure 26:
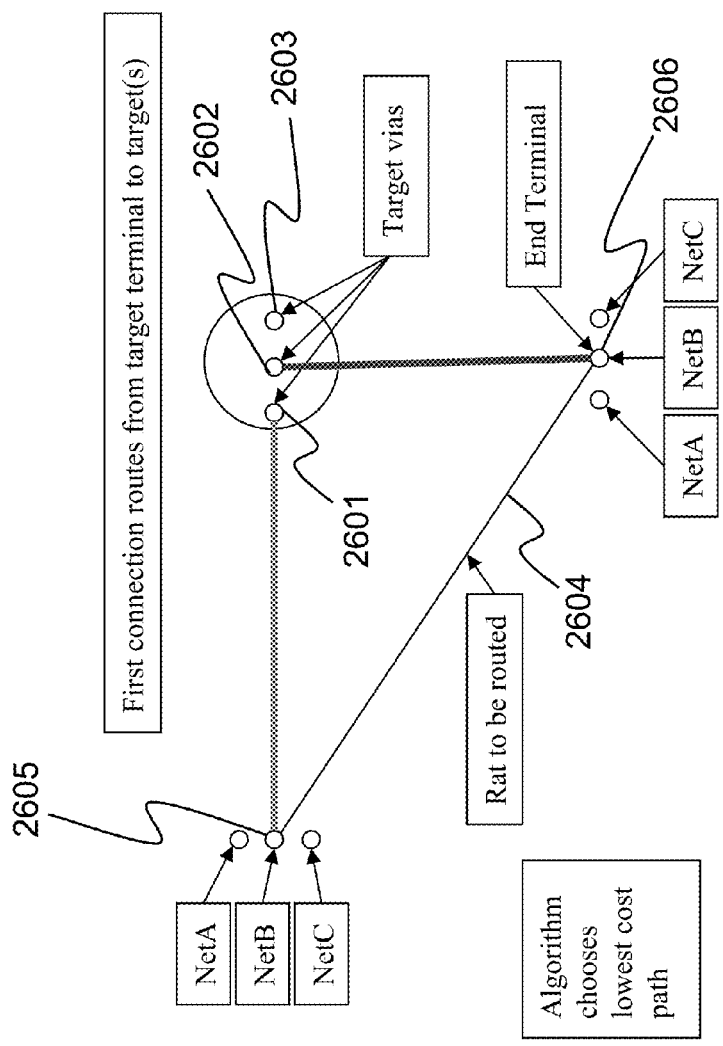
FIG. 26 is a schematic view showing an illustrative second stage in an exemplary embodiment of the present invention.

FIG. 26 continues the routing of a Net B terminal to another Net B terminal. The rat to be routed 2604 indicates that Net B source terminal is to be connected to Net B target terminal, this may be an illustrative line derived from the net list. Therefore, end terminal 2606 is routed to the least cost via 2602. The flow via in this Fig. has a via 2601 connected to start terminal 2605 and also a via 2603 which is unused presently.

Figure 27:
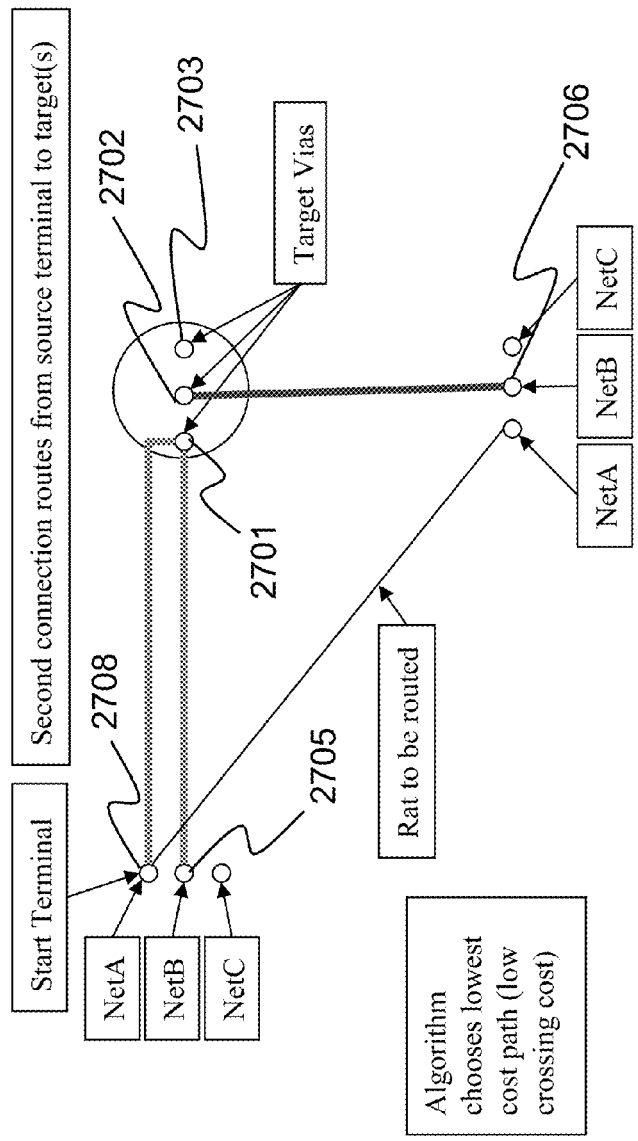
FIG. 27 is a schematic view showing yet another stage in an exemplary embodiment of the present invention.

FIG. 27 shows a further iteration wherein start terminal 2708 has been routed to its least cost via 2701, thereby creating a cross between Net A and Net B start terminals 2708 and 2705, respectively. The Net B end terminal 2706 maintains its lowest cost path to via 2702 and via 2703 is unassigned.

Figure 28:
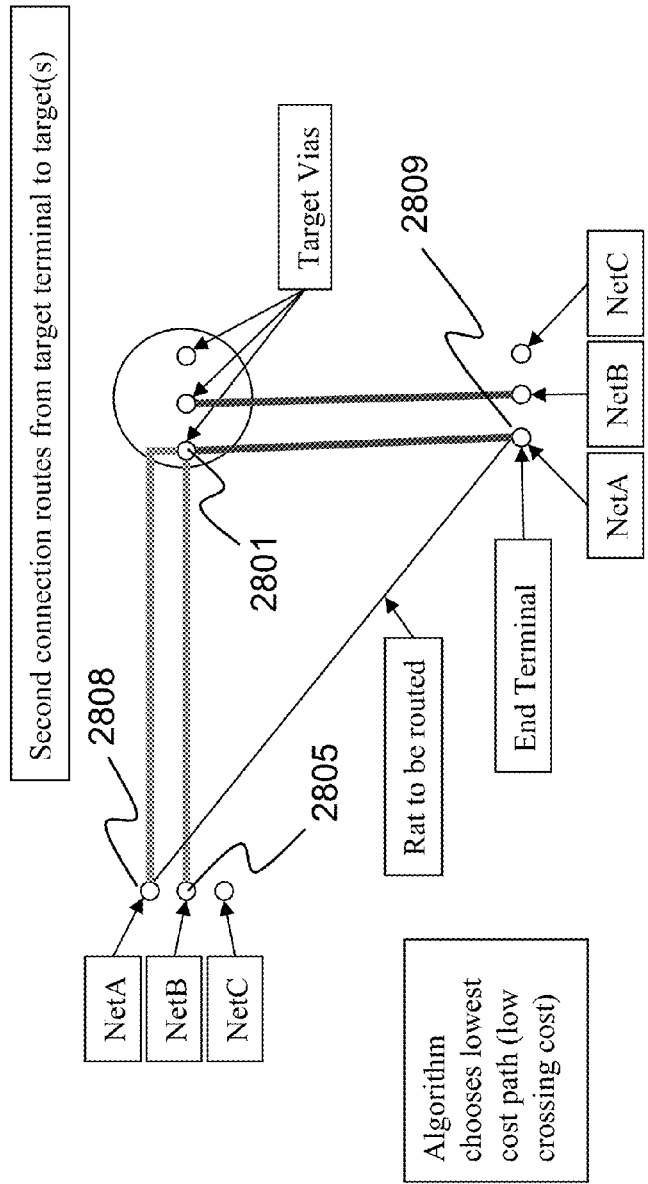
FIG. 28 is a schematic view showing a further stage in an exemplary method in accordance with several embodiments of the present invention.

FIG. 28 furthers the progress showing a Net A end terminal 2809 routed to its lowest cost via 2801, thereby Net A start 2808 is indeed connected to Net A end terminal 2809 through the intermediate via 2801. However, a cross still exists between Net A start terminal 2808 and Net B start terminal 2805.

Figure 29:
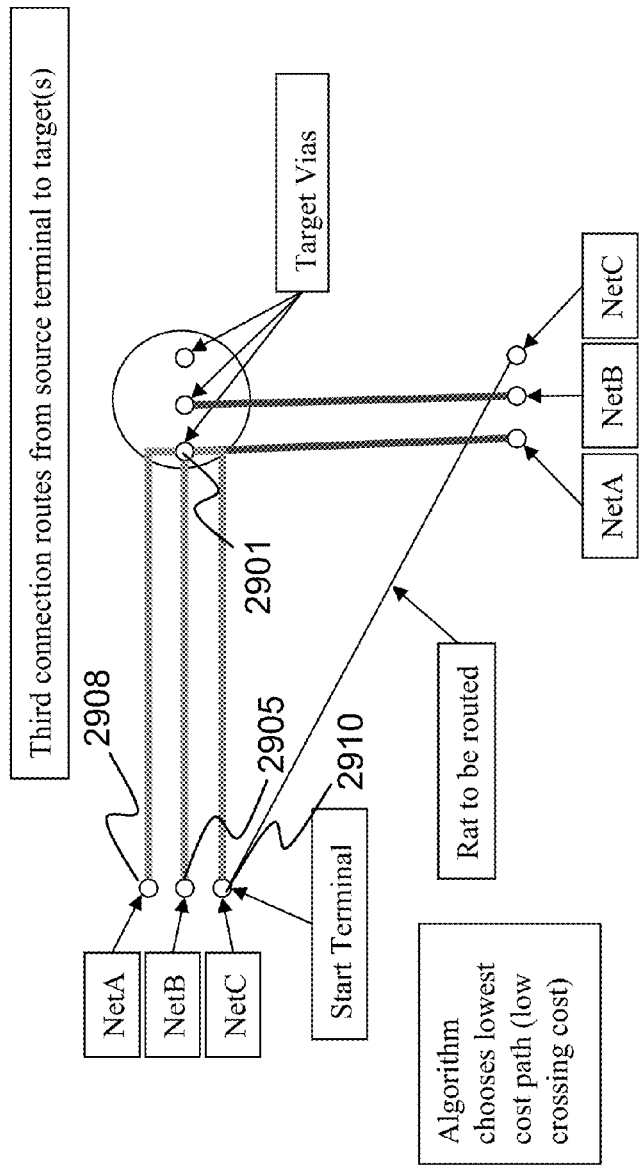
FIG. 29 is a schematic view showing still a further stage illustrating a progression through an exemplary embodiment of the present invention showing the initial acceptance of electrical misconnections and the subsequent resolution thereof.

FIG. 29 shows a further progression in that Net C start terminal 2910 has been routed to its lowest cost via 2901, resulting in a three-way cross between Net A, Net B, and Net C start terminals as they all connect to via 2901.

Figure 30:
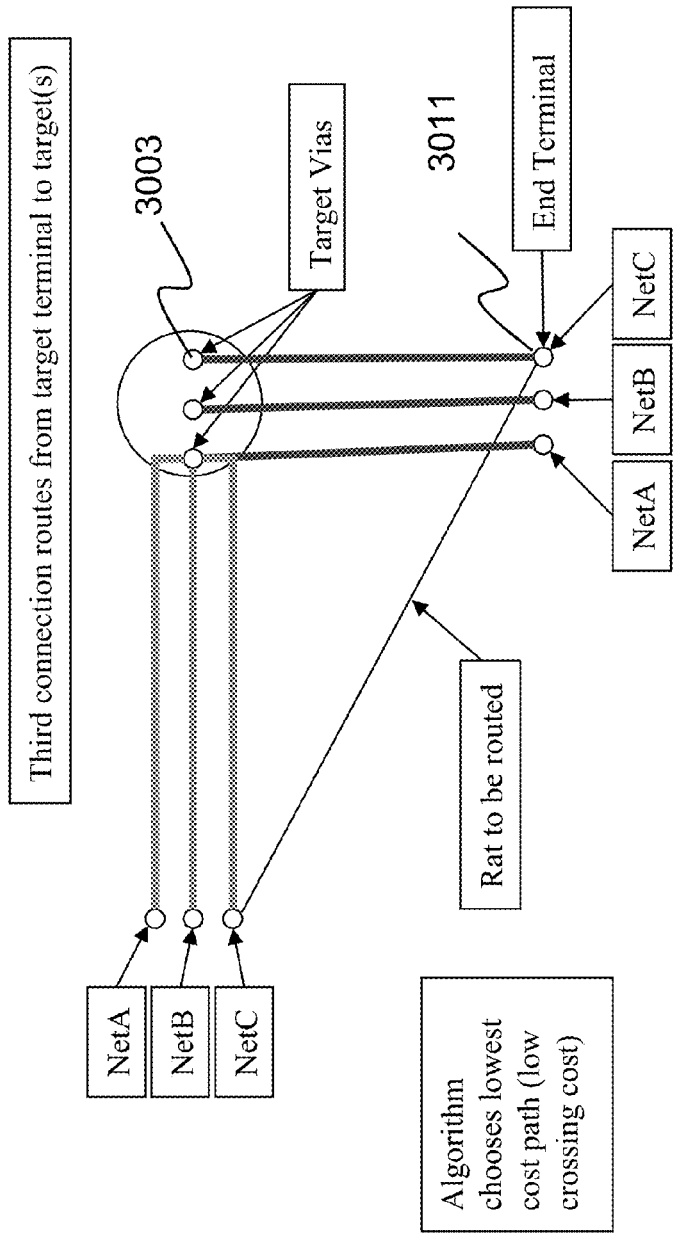
FIG. 30 is a schematic view showing another stage in accordance with an exemplary embodiment of the present invention.

FIG. 30 shows a further progression in that Net C end terminal 3011 has now been routed to target via 3003 which is its least cost path to a via. All nets will eventually be routed in a most optimal fashion, or nets which are unable to be routed will be reported to the user through an error message or log.

Figure 31:
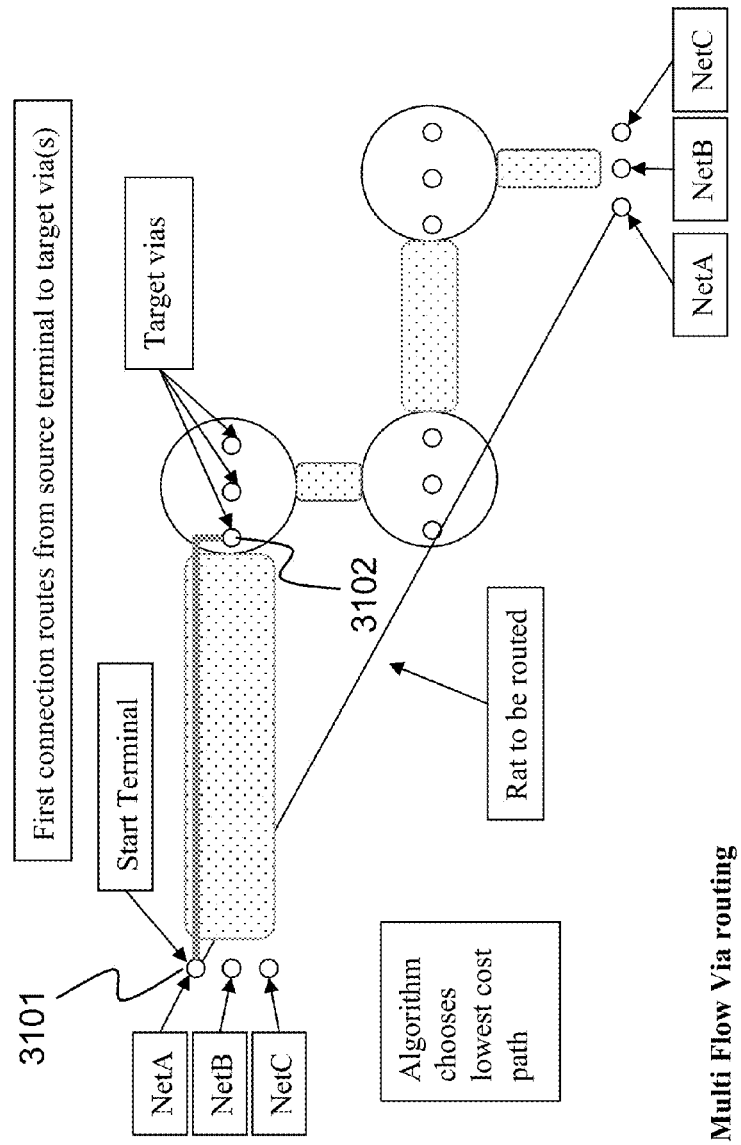
FIG. 31 is a schematic view illustrating an initial stage of an auto router for multi flow via routing in accordance with several embodiments of the present invention.

FIG. 31 shows a further embodiment with a plurality of target flow vias between source or start terminals and end or target terminals. In this case, it is indicated that Net A start terminal is to be connected to Net A end terminal. Therefore, at a first step, Net A start terminal 3101 is routed to a lowest cost via 3102.

Figure 32:
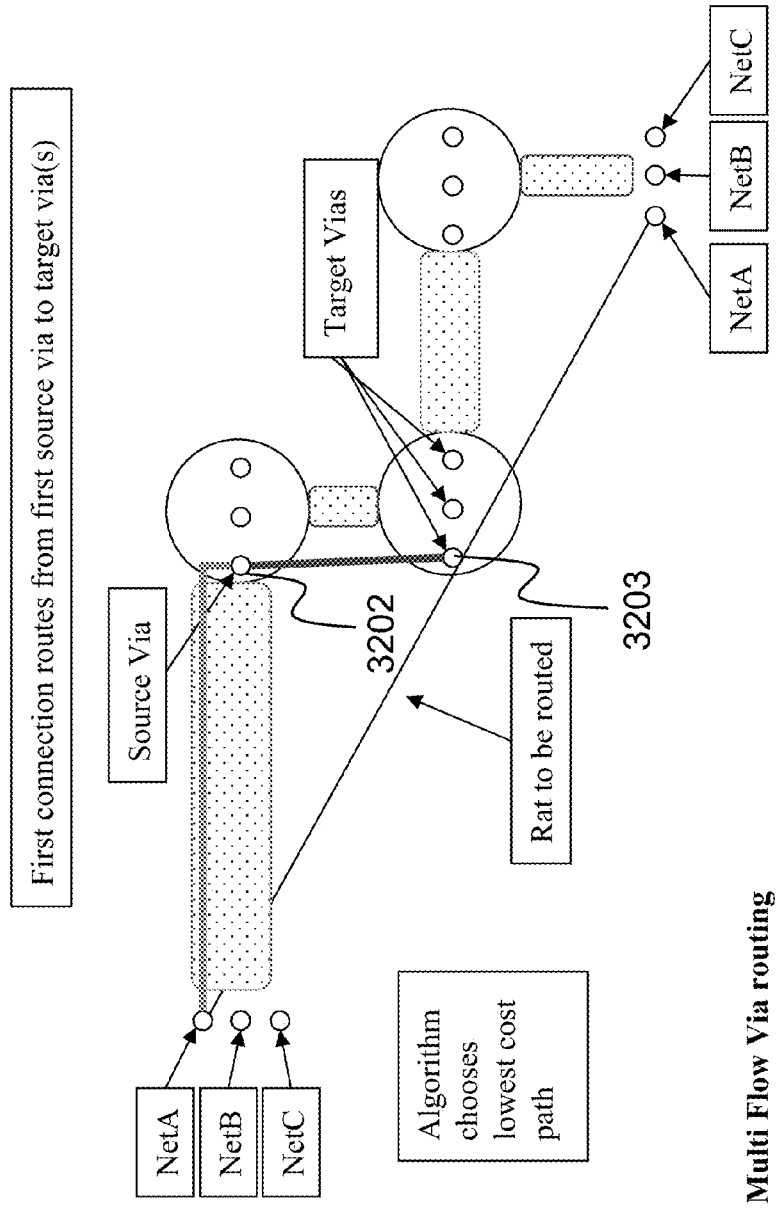
FIG. 32 is a schematic view showing a further stage of an exemplary multi flow via routing embodiment of the present invention.

Subsequently, as seen in FIG. 32, the via 3202 is set as the source or start terminal and the vias of the next subsequent flow via are all seeded as target vias. The shortest path route between via 3202 and the target vias results with a connection to target via 3203.

Figure 33:
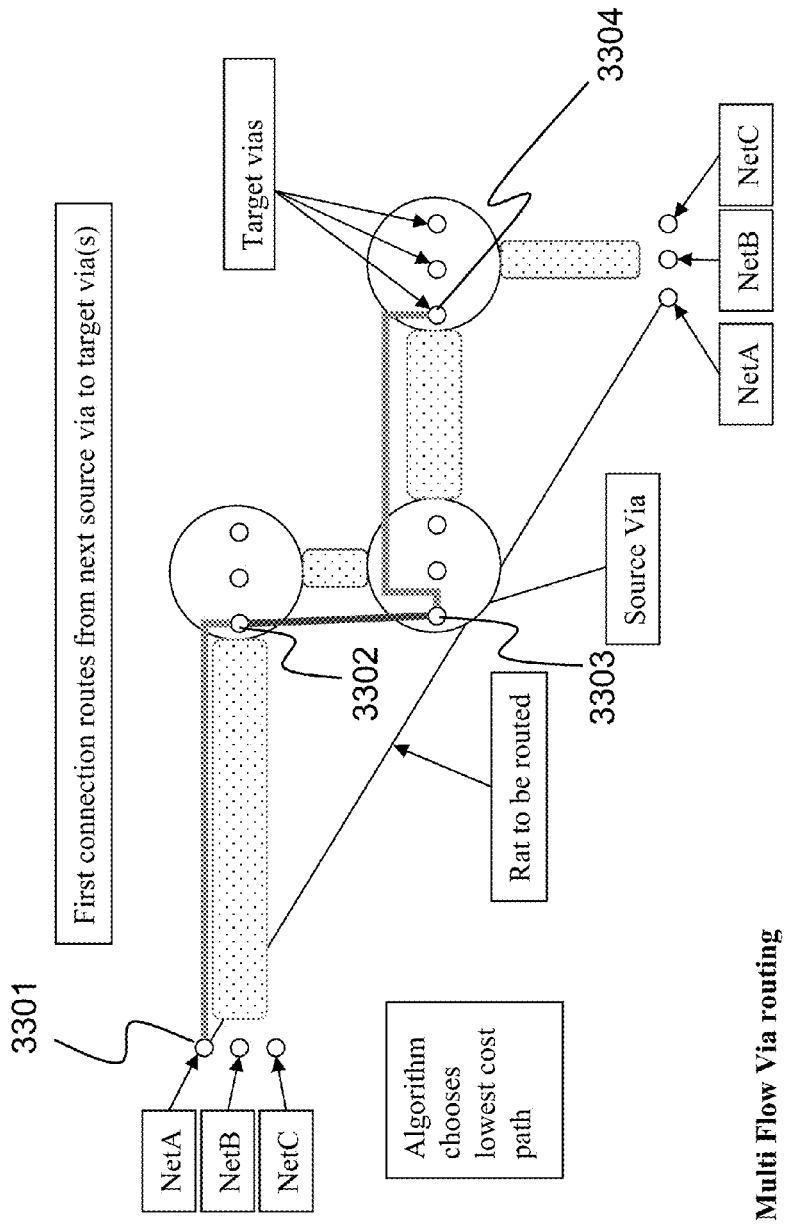
FIG. 33 is a schematic view showing yet a further stage of an exemplary multi flow via embodiment of the present invention.

Subsequently, in FIG. 33, the via 3303 is reset to be the source or start terminal and the target vias at the next flow via are seeded to be target vias. Thereby, the shortest path between source via 3303 and any of the seeded target vias is found. In this instance, target via 3304 has been identified as the shortest path between source via 3303 and any of the target vias in the ultimate or final flow via.

Figure 34:
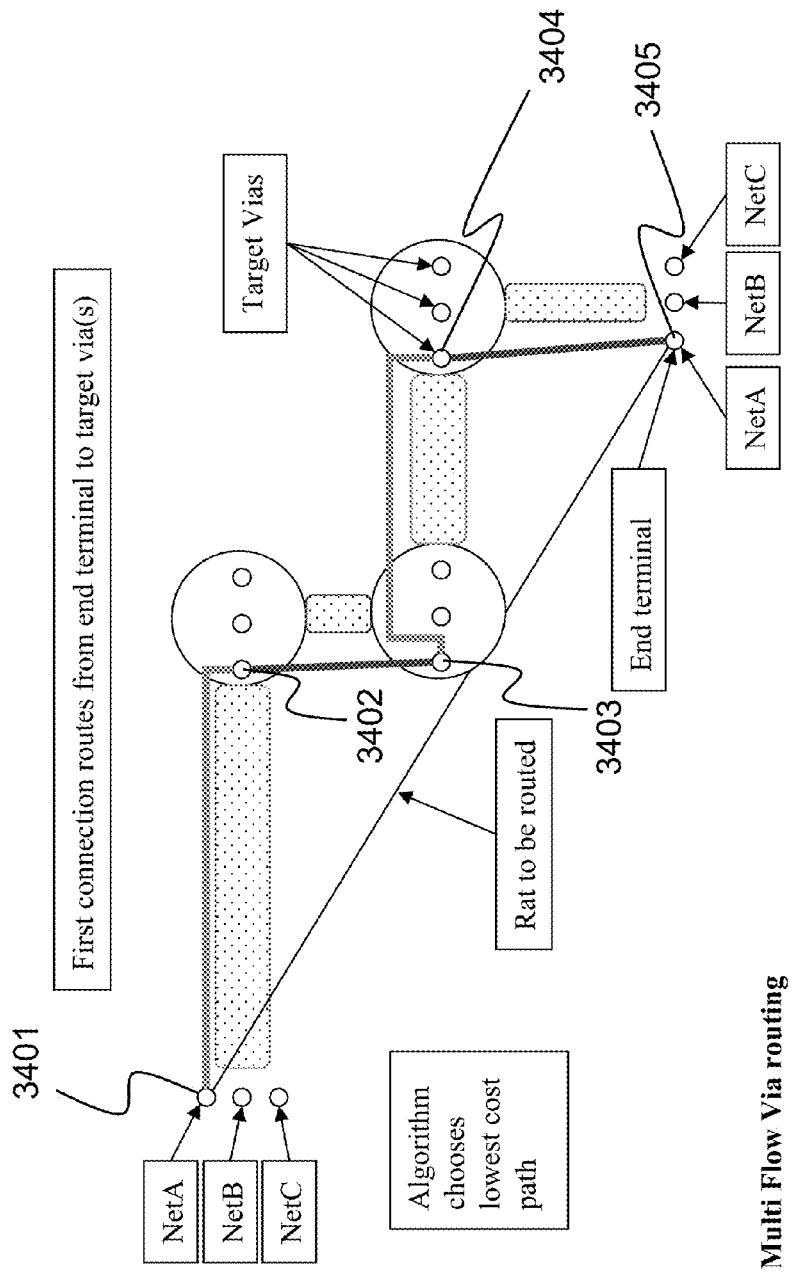
FIG. 34 is a schematic view yet another illustrative stage of a method in accordance with several exemplary embodiments of the present invention, herein showing a completed path from a source terminal of net A to a target terminal of net A.

Lastly, as seen in FIG. 34, a Net A end terminal 3405 is seeded as the source or start and the target vias (including via 3404) at the last flow via are seeded as target vias. Accordingly, Net A end terminal 3405 searches out the closest target via amongst the seeded target vias and locates target via 3404 as its least-cost connecting via. Thereby, a complete net connection from Net A start terminal 3401 is ultimately connected to Net A end terminal 3405 through a first via 3402, second via 3403, and a third via 3404. Using this approach, any number of intermediate vias may be utilized to reach from one layer to another. Thereby a path has been generated from start terminal to end terminal. In likewise fashion, Net B, Net C . . . Net n, etc., will be routed.

Figure 35:
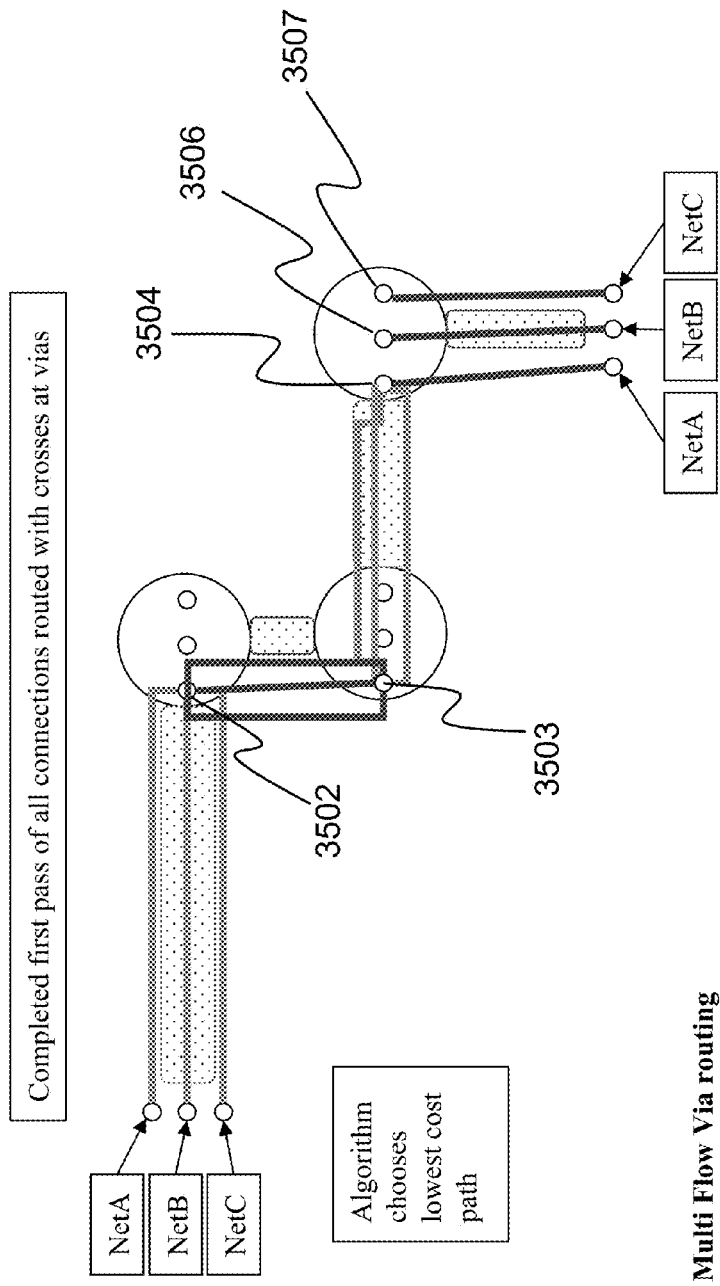
FIG. 35 is a schematic view showing another illustrative example of a stage in accordance with several exemplary embodiments of the present invention.

FIG. 35 shows a fully routed first pass or first iteration of an illustrative method in accordance with an exemplary embodiment of the subject invention. However, it is seen that a number of electrical misconnections, crosses, opens, and disconnects appear and thus the conflict resolution engine should be executed. Such a determination may be made by performing a survey or inspection of the resultant routed connections and tabulating which terminals are effectively electrically connected. Several exemplary situations may indicate a misconnection, if, during the survey, it is detected that, for example:

a start terminal is connected to another start terminal;

an end terminal is connected to an end terminal;

a plurality of start terminals are electrically coupled to a plurality of end terminals; or a start or end terminal remains unconnected contra to predefined intended connections.

For example, it is seen that a multi-cross condition exists at via 3502, another at 3503, and yet another at 3504 with vias 3506 and 3507 remaining disconnected or open. Therefore, it is seen that the routing has not completed.

Figure 36:
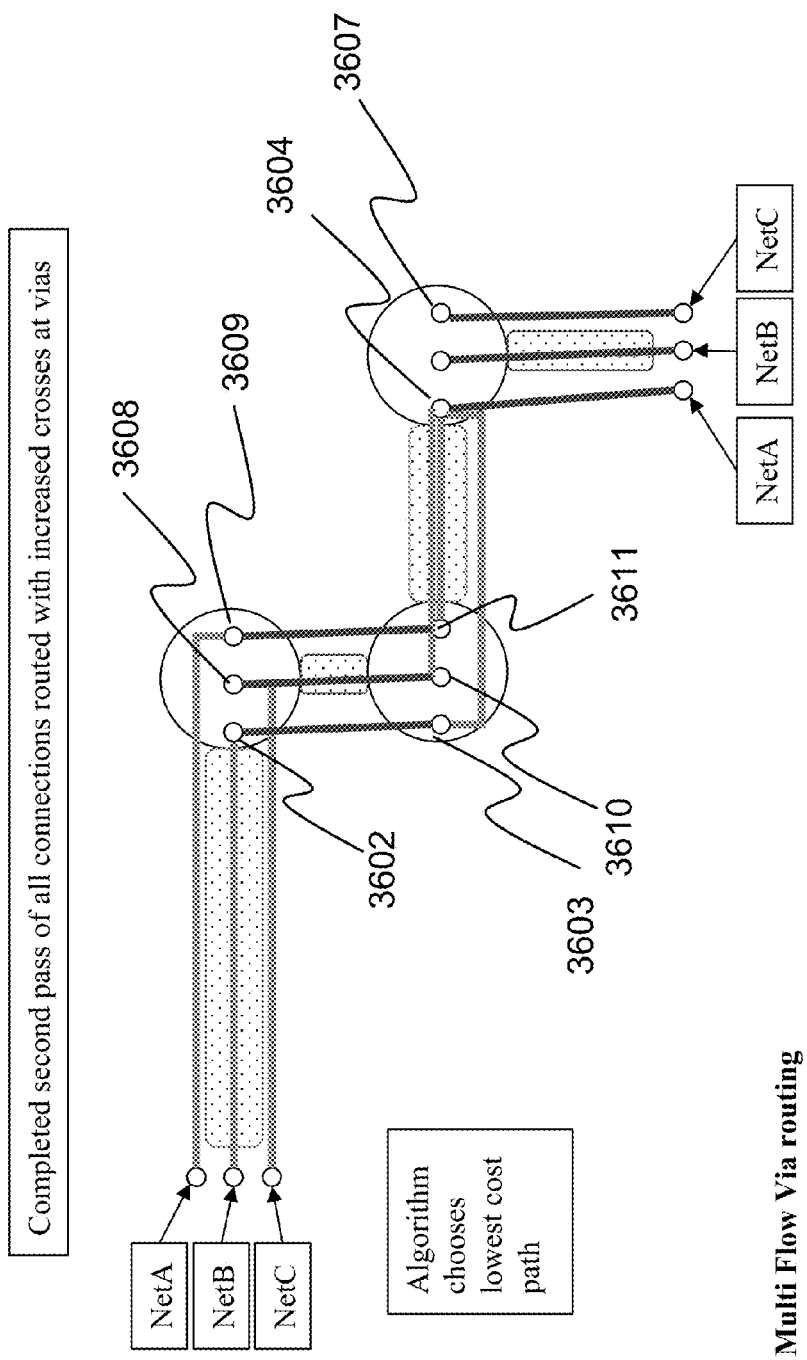
FIG. 36 is a schematic view showing yet another simplified exemplary illustration of a further stage in accordance with several embodiments of the present invention.
Figure 37:
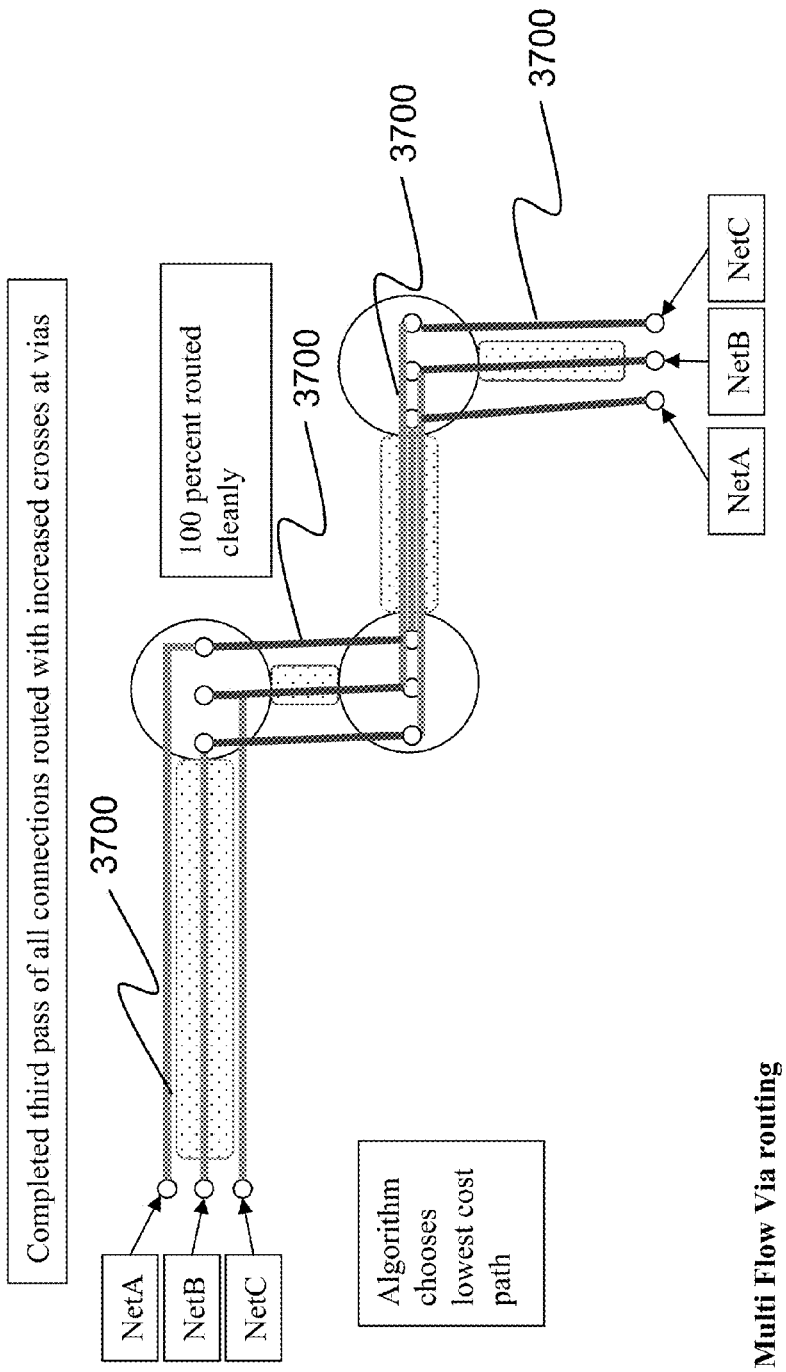
FIG. 37 is a schematic view showing an exemplary completed routing between the first set of terminals and the second set of terminals passing through a plurality of intermediate flow vias in accordance with several embodiments of the present invention; and, FIG. 38 is a simplified schematic view showing several exemplary routing conflicts; and, FIG. 39 is a simplified flow diagram illustrating an exemplary conflict resolution routing flow.

FIG. 36 shows an increased cost for crosses thus forcing the nets to competitively route themselves in the most optimum, efficient, and least expensive routing, thereby resulting in no cross conditions. It is seen that through these iterations, the crosses, opens, or disconnects are pushed more towards the end flow via and towards the ending terminals. As the cross at via 3602 has been resolved, the crosses at vias 3608, 3609, 3603, 3610, 3611, have also been resolved. However, there remains a crossing condition between Nets A, B, and C at via 3604 and at least two remaining opens or disconnects such as at via 3607. Therefore, and as seen in FIG. 37, the conflict resolution engine further increases the cost of crosses prohibitively in a penalizing type manner, such that the finished route is completely free of all crosses at all vias, thereby, it is seen that a Net A terminal connects cleanly to another Net A terminal; a Net B terminal connects cleanly to another Net B terminal; and a Net C terminal connects cleanly to another Net C terminal, with no crosses, opens, disconnects, or any electrical misconnections.

While it is seen that a conflict resolution method in accordance with the present invention, in a preferred embodiment, proceeds from Net A complete routing to Net B complete routing to Net C complete routing, it may be that all of Nets A, B, and C, in an exemplary embodiment are routed first from a first direction to a flow via and then all of Nets A, B, and C from an end or target terminal are then routed to a flow via in the opposite direction. Such order may be reversed, interposed, or interposed. Such an arrangement may be beneficial in routing a component with swappable pins or terminals. Such swappable pins may be moved, swapped, and/or rearranged, to reduce congestion and/or eliminate conflicts.

An illustrative pseudo-code example for an exemplary method in accordance with a single flow via routing includes: 1) All individual vias of the flow via are seeded as targets. Vias with existing connections on different nets than the current routing net are seeded with additional crossing cost; 2) Start terminal is seeded; 3) Wavefront progresses from start terminal to target vias until the lowest cost solution is found and the path is installed; 4) Router connects from the other direction from the ending terminals; 5) All individual vias of the flow vias are seeded as targets. Vias with existing connections on different nets than the current routing net are seeded with additional crossing costs; 6) End of terminal is seeded; 7) Wavefront progresses from end terminal to target vias until the lowest cost solution is found and the path is installed; 8) Repeat steps 1-7 until all rats of the flow have been connected.

An exemplary pseudo code methodology for multiple flow vias may illustratively include: 1) All individual vias of first flow via in the sequence from start terminal to end terminal are seeded as targets. Vias with existing connections on different nets than the current routing net are seeded with additional crossing cost; 2) Start terminal is seeded; 3) Wavefront progresses until the lowest cost solution is found and the path is installed. Path will preferably go from start terminal to the first flow via in the sequence from start terminal to end terminal; 4) Router then connects the next flow via in the sequence from start terminal to end terminal. The individual vias of the next flow via in the sequence from start terminal to end terminal are seeded as target vias. Vias with existing connections on different nets than the current routing nets are seeded with additional crossing cost; 5) The current via from the previous path is seeded as the source; 6) Wavefront progresses until the lowest cost solution is found and the path is installed. Path will preferably go from source via to the next flow via in the sequence from source terminal to target terminal; 7) Repeat steps 4-6 until all flow vias have been connected from the start terminal to the last via before the end terminal; 8) Now the router should connect from the other direction; 9) All individual vias of the first flow via in the sequence from the end terminal to the start terminal are seeded as targets. Those vias with existing connections on different nets than the current routing net are seeded with additional crossing costs; 10) End terminal is seeded; 11) Wavefront progresses until the lowest cost solution is found and the path is installed. The path will generally go from the target terminal to the first flow via in the sequence from end terminal to start terminal; 12) Repeat steps 1-11 until all rats in the flow have been connected.

Figure 38:
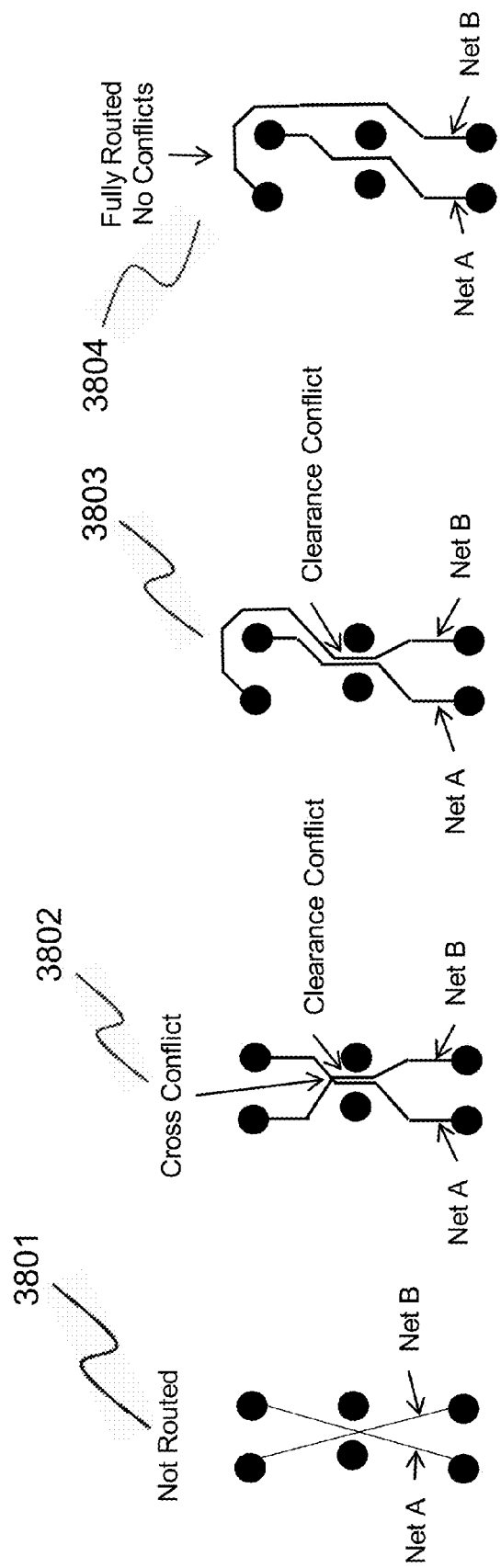

FIG. 38 shows a simplified schematic of exemplary routing conflicts. Conflict 3801 illustrates a cross or short-circuit of Net A and Net B. Conflict 3802 shows another simplified conflict illustrating both a cross conflict where Nets A and B have crossed resulting in at least one short-circuit, and also a clearance conflict where the two rats may not maintain a necessary clearance therebetween and/or between the intermediate obstacles when passing therethrough. Conflict 3803 shows an exemplary succeeding iteration of the conflict resolution flow wherein one connection rat has been determined to be less expensive to regenerate. Accordingly one rat is left undisturbed while the other rat is regenerated to follow a path that has less misconnection or conflict cost and is therefore cheaper or less expensive overall, stated potentially as; overall cost=geometric cost+conflict cost. Thereby the crossing or misconnection has been resolved (though the path length and turns have increased). Unfortunately, a clearance conflict remains extant. Conflict resolution flow then regenerates at least a portion of Net B to proceed to a fully-routed conflict-free state 3804 where each terminal is connected properly based on predetermined nets and a shortest distance without conflicts or crosses.

Figure 39:
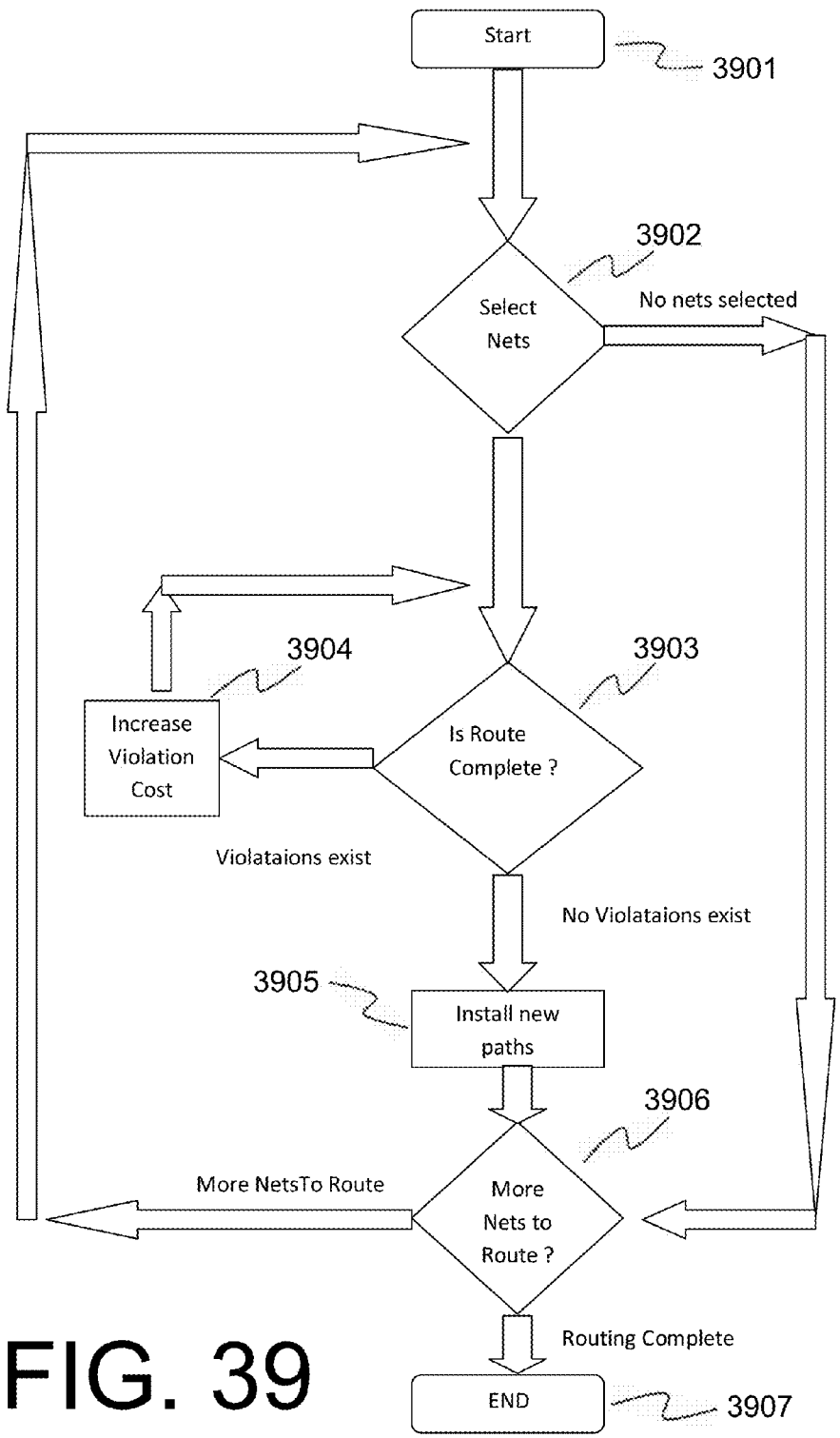

FIG. 39 shows a simplified flow diagram starting at block 3901 and progressing to select a net 3902 between a start terminal and an end terminal. If no nets have been selected and there are no more nets to route then flow proceeds to END block 3907. For a selected net, it is evaluated whether the route from a start terminal to an end terminal is complete. If the net is complete (meaning that there exists a complete interconnection therebetween) then the net is installed as a path in the layout or circuit mask. If however the route is incomplete, then violations exist and flow proceeds to block 3904. The violations may be a conflict, as illustratively shown in FIG. 38 or may further be an open/disconnect; a cross or short—such as a terminal of Net A being incorrectly routed to a terminal of Net B, and the like. To remedy such a violation, the cost of the violation is increased and a route is regenerated based on the cost of the increased violation and the shorter path versus the geometrical cost of an alternate path (including the predetermined set of criteria such as distance, turns, and adherence to flow indication). Eventually the cost of violations/conflicts/misconnections will become so high that even if the geometrical cost of one of the paths (while potentially high itself) will be less than the increasing violation cost coupled with the shorter distance path. Once the route has been completed, block 3903 will be satisfied and the route/path will be installed at block 3905. Lastly a positive evaluation of "More Nets to Route" block 3906 will return the flow to block 3902 to select another net; however if evaluation of block 3906 is negative, then routing is complete and the flow proceeds to "End" block 3907.

Thereby, a designer with minimal effort, expended time, reduced chance of errors, and reduced costs, may have an automated system and method for routing between terminals through a plurality of intermediate vias.

Although this invention has been described in connection with specific forms and embodiments thereof, it will be appreciated that various modifications other than those discussed above may be resorted to without departure from the spirit or scope of the invention. For example, equivalent elements may be substituted for those specifically shown and described, certain features may be used independently of other features, and in certain cases, particular combinations of circuit design and implementation of flows or processing steps may be reversed or interposed, all without departing from the spirit or scope of the invention as defined in the appended Claims.

What is claimed is:

1. A method for routing between terminals through respective intermediate vias, the method comprising:

establishing a circuit design implemented on a plurality of circuit layers, said circuit design including a set of first terminals, a set of second terminals, and a plurality of vias extending between adjacent ones of the circuit layers;

predefining a plurality of intended connections between said first terminals and corresponding ones of said second terminals;

executing a processor to selectively generate a least-cost forward connection path between each of said first terminals and a corresponding one of said vias, and a least-cost reverse connection path between each of said second terminals and a respective one of said vias;

executing a conflict resolution engine responsive to detection of a conflict between said least-cost forward connection paths and between said least-cost reverse connection paths to maintain at most one each of said least-cost forward and least-cost reverse connection paths coupled to each said via; and, selectively pairing said least-cost forward and reverse connection paths connected to the same via according to said predefinition of intended connections to generate at least one routing connection.

2. The method as recited in claim 1, wherein said routing connection is selectively generated from a plurality of candidate connections each including a pair of individual least-cost forward and reverse connection paths commonly coupled to one of said vias, said routing connection corresponding to one of said intended connections.

3. The method as recited in claim 2, further comprising at least one of said least cost forward and reverse connection paths is regenerated responsive to execution of said conflict resolution engine.

4. The method as recited in claim 2, wherein at least one said candidate connection path failing to correspond to any of said intended connections is regenerated responsive to execution of said conflict resolution engine.

5. The method as recited in claim 2, wherein said conflict resolution engine executes a cost-based resolution in resolving conflict detected between said least-cost forward connection paths and between said least-cost reverse connection paths, and in regenerating said candidate connections.

6. The method as recited in claim 1, wherein said intended connections are identified in a predefined netlist.

7. The method as recited in claim 1, wherein the detected conflict includes a disconnect or a cross between terminals.

8. The method as recited in claim 1, further comprising selectively arranging a plurality of vias at a predetermined area of said circuit design.

9. The method as recited in claim 8, wherein said plurality of vias are grouped into a flow via, selectively configured and placed at the predetermined location in said circuit design.

* * * * *